(12) United States Patent
Higashino

(10) Patent No.: US 11,521,651 B2
(45) Date of Patent: Dec. 6, 2022

(54) RECORDING APPARATUS, RECORDING METHOD, REPRODUCTION APPARATUS, REPRODUCTION METHOD, RECORDING MEDIUM, ENCODING APPARATUS, AND DECODING APPARATUS

(71) Applicant: SONY CORPORATION, Tokyo (JP)

(72) Inventor: Satoru Higashino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/287,860

(22) PCT Filed: Oct. 16, 2019

(86) PCT No.: PCT/JP2019/040573
§ 371 (c)(1),
(2) Date: Apr. 22, 2021

(87) PCT Pub. No.: WO2020/090457
PCT Pub. Date: May 7, 2020

(65) Prior Publication Data
US 2021/0383835 A1    Dec. 9, 2021

(30) Foreign Application Priority Data

Oct. 29, 2018 (JP) ............................. JP2018-202533

(51) Int. Cl.
*G11B 7/24088* (2013.01)
*G11B 20/14* (2006.01)
(Continued)

(52) U.S. Cl.
CPC ...... *G11B 20/1496* (2013.01); *G11B 7/24088* (2013.01); *G11B 20/1217* (2013.01); *G11B 20/1423* (2013.01); *G11B 27/3027* (2013.01)

(58) Field of Classification Search
None
See application file for complete search history.

(56) References Cited

U.S. PATENT DOCUMENTS 5,537,382 A * 7/1996 McLaughlin ....... H04L 25/4975
714/778
5,668,546 A * 9/1997 McLaughlin ........... H03M 5/20
341/59

(Continued)

FOREIGN PATENT DOCUMENTS

CN        1447314 A    10/2003
CN      101009110 A     8/2007
(Continued)

OTHER PUBLICATIONS

Lee, 4-ary (1,2) run-length limited code for optical storage channels, Electronics Letters, Apr. 1, 1999, pp. 580-581, vol. 35, No. 7.

(Continued)

*Primary Examiner* — Peter Vincent Agustin
(74) *Attorney, Agent, or Firm* — Paratus Law Group, PLLC

(57) ABSTRACT

There is provided a recording apparatus, a recording method, a reproduction apparatus, a reproduction method, a recording medium, an encoding apparatus, and a decoding apparatus which enable recording or reproduction to be easily implemented at high line density. User data is encoded into a multilevel edge code, and a multilevel code whose value changes in accordance with the multilevel edge code is recorded. The multilevel edge code is generated through state transition of a code generation model which includes a state representing the number of times that zero is consecutive corresponding to a number of ways of the number of times that zero is consecutive, which is the number of times that an edge of 0 is consecutive among edges representing a change amount from an immediately preceding value of the multilevel code of an ML value which is equal to or greater than 3, and which transitions to a state representing the number of times that zero is consecutive including 0 in a case where 0 is output, and transitions to a state representing (Continued)

that the number of times that zero is consecutive is 0 times in a case where one of 1 to ML−1 is output.

18 Claims, 43 Drawing Sheets

(51) Int. Cl.
    *G11B 20/12*     (2006.01)
    *G11B 27/30*     (2006.01)

(56) References Cited

U.S. PATENT DOCUMENTS

| | | | | |
|---|---|---|---|---|
| 5,781,130 | A * | 7/1998 | McLaughlin | H04L 25/4917 341/59 |
| 6,272,105 | B1 * | 8/2001 | Hayashi | G11B 7/00745 |
| 6,370,097 | B1 | 4/2002 | Hayashi et al. | |
| 6,385,255 | B1 | 5/2002 | McLaughlin et al. | |
| 9,252,808 | B1 | 2/2016 | Guo et al. | |
| 2003/0223341 | A1 | 12/2003 | Minagawa | |
| 2005/0147020 | A1 * | 7/2005 | Van Someren | G11B 7/24085 369/59.1 |
| 2006/0203706 | A1 * | 9/2006 | Xu | G11B 7/24088 |
| 2021/0383835 | A1 * | 12/2021 | Higashino | H03M 5/20 |

FOREIGN PATENT DOCUMENTS

| | | |
|---|---|---|
| CN | 101097759 A | 1/2008 |
| CN | 102063918 A | 5/2011 |
| JP | 2000348345 A | 12/2000 |
| JP | 2004005787 A | 1/2004 |
| JP | 2016-208401 A | 12/2016 |
| KR | 20050092603 A | 9/2005 |
| TW | 201807704 A | 3/2018 |
| WO | WO 2008/138707 A1 | 11/2008 |
| WO | WO 2016/175035 A1 | 11/2016 |
| WO | WO 2017/204001 A1 | 11/2017 |

OTHER PUBLICATIONS

McLaughlin, Five Runlength-Limited Codes for M-ary Recording Channels, IEEE Transactions On Magnetics, May 1, 1997, pp. 2442-2450, vol. 33, No. 3.

Ashwin Kumar, et al., "Design of Close-to-Capacity Constrained Codes for Multi-Level Optical Recording" IEEE Transactions on Communications, Apr. 14, 2009 Full text.

Hua Hu, et al., "Modulation Code and PRML Detection for Multi-Level Run-Length-Limited DVD Channels", Optical Data Storage Topical Meeting, Jun. 5, 2006 Full text.

* cited by examiner

FIG. 11

| CODE LENGTH n (CELL) | THE NUMBER OF SYMBOLS Ns | log₂(Ns) | BIT LENGTH B OF BINARY DATA | CODE RATE R (=B/n) | CODING EFFICIENCY Ef |
|---|---|---|---|---|---|
| 2 | 24 | 4.584963 | 4 | 2 | 86% |
| 3 | 120 | 6.906891 | 6 | 2 | 86% |
| 4 | 600 | 9.228819 | 9 | 2.25 | 97% |
| 5 | 2996 | 11.54882 | 11 | 2.2 | 95% |
| 6 | 14976 | 13.87036 | 13 | 2.166667 | 93% |
| 7 | 74864 | 16.19198 | 16 | 2.285714 | 98% |
| 8 | 374224 | 18.51354 | 18 | 2.25 | 97% |
| 9 | 1870640 | 20.8351 | 20 | 2.222222 | 96% |
| 10 | 9350800 | 23.15666 | 23 | 2.3 | 99% |
| 11 | 46742016 | 25.47822 | 25 | 2.272727 | 98% |
| 12 | 233650176 | 27.79977 | 27 | 2.25 | 97% |
| 13 | 1167951424 | 30.12133 | 30 | 2.307692 | 99% |

| MULTILEVEL EDGE CODE | INITIAL STATE | | | | | FINAL STATE |
|---|---|---|---|---|---|---|
| 1111 | s0 | s0 | s0 | s0 | s0 | s0 |
| 2111 | s0 | s0 | s0 | s0 | s0 | s0 |
| 3111 | s0 | s0 | s0 | s0 | s0 | s0 |
| 1211 | s0 | s0 | s0 | s0 | | s0 |
| ... | : | | | | | |
| 0002 | s0 | s1 | s2 | s3 | | s0 |
| 0003 | s0 | s1 | s2 | s3 | | s0 |
| 0004 | s0 | s1 | s2 | s3 | | s0 |

B

| MULTILEVEL EDGE CODE | INITIAL STATE | | | | | FINAL STATE |
|---|---|---|---|---|---|---|
| 1111 | s1 | s0 | s0 | s0 | s0 | s0 |
| 2111 | s1 | s0 | s0 | s0 | s0 | s0 |
| 3111 | s1 | s0 | s0 | s0 | s0 | s0 |
| 1211 | s1 | s0 | s0 | s0 | | s0 |
| ... | : | | | | | |
| 0002 | s1 | s2 | s3 | s4 | | s0 |
| 0003 | s1 | s2 | s3 | s4 | | s0 |
| 0004 | s1 | s2 | s3 | s4 | | s0 |

| MULTILEVEL EDGE CODE | INITIAL STATE | | | | FINAL STATE |
|---|---|---|---|---|---|
| 1110 | s0 | s0 | s0 | s0 | s1 |
| 2110 | s0 | s0 | s0 | s0 | s1 |
| 3110 | s0 | s0 | s0 | s0 | s1 |
| 1210 | s0 | s0 | s0 | s0 | s1 |
| ... | : | | | | |
| 0020 | s0 | s1 | s2 | s0 | s1 |
| 0030 | s0 | s1 | s2 | s0 | s1 |
| 0040 | s0 | s1 | s2 | s0 | s1 |

B

| MULTILEVEL EDGE CODE | INITIAL STATE | | | | FINAL STATE |
|---|---|---|---|---|---|
| 1110 | s1 | s0 | s0 | s0 | s1 |
| 2110 | s1 | s0 | s0 | s0 | s1 |
| 3110 | s1 | s0 | s0 | s0 | s1 |
| 1210 | s1 | s0 | s0 | s0 | s1 |
| ... | : | | | | |
| 0020 | s1 | s2 | s3 | s0 | s1 |
| 0030 | s1 | s2 | s3 | s0 | s1 |
| 0040 | s1 | s2 | s3 | s0 | s1 |

| START CONTINUOUS LENGTH \ TERMINATION CONTINUOUS LENGTH | 0 | 1 | 2 | 3 |
|---|---|---|---|---|
| 0 | 336 | 68 | 16 | 4 |
| 1 | 52 | 12 | 0 | 0 |
| 2 | 12 | 0 | 0 | 0 |
| 3 | 0 | 0 | 0 | 0 |

B

| START CONTINUOUS LENGTH \ TERMINATION CONTINUOUS LENGTH | 0 | 1 | 2 | 3 |
|---|---|---|---|---|
| 0 | 84 | 0 | 0 | 0 |
| 1 | 12 | 0 | 0 | 0 |
| 2 | 4 | 0 | 0 | 0 |
| 3 | 0 | 0 | 0 | 0 |

FIG. 18

| BINARY DATA (DECIMAL) | MULTILEVEL EDGE CODE (4CELL) |
|---|---|
| 0 | 1111 |
| 1 | 2111 |
| 2 | 3111 |
| 3 | 1211 |
| 4 | 2211 |
| 5 | 4211 |
| 6 | 1311 |
| 7 | 3311 |
| 8 | 4311 |
| 9 | 2411 |
| 10 | 3411 |
| 11 | 4411 |
| 12 | 1121 |
| 13 | 2121 |
| 14 | 3121 |
| 15 | 1221 |
| 16 | 2221 |
| 17 | 4221 |
| 18 | 1321 |
| 19 | 3321 |
| 20 | 4321 |
| 21 | 2421 |
| 22 | 3421 |
| 23 | 4421 |
| 24 | 1131 |
| 25 | 2131 |
| 26 | 3131 |
| 27 | 1231 |
| 28 | 2231 |
| 29 | 4231 |
| 30 | 1331 |
| 31 | 3331 |
| 32 | 4331 |
| 33 | 2431 |
| 34 | 3431 |
| 35 | 4431 |
| 36 | 1112 |
| 37 | 2112 |
| 38 | 3112 |
| 39 | 1212 |
| 40 | 2212 |
| 41 | 4212 |
| 42 | 1312 |
| 43 | 3312 |
| 44 | 4312 |
| 45 | 2412 |
| 46 | 3412 |
| 47 | 4412 |
| 48 | 1122 |
| 49 | 2122 |
| 50 | 3122 |
| 51 | 1222 |
| 52 | 2222 |
| 53 | 4222 |
| 54 | 1322 |
| 55 | 3322 |
| 56 | 4322 |
| 57 | 2422 |
| 58 | 3422 |
| 59 | 4422 |
| 60 | 1142 |
| 61 | 2142 |
| 62 | 3142 |
| 63 | 1242 |
| 64 | 2242 |
| 65 | 4242 |
| 66 | 1342 |
| 67 | 3342 |
| 68 | 4342 |
| 69 | 2442 |
| 70 | 3442 |
| 71 | 4442 |
| 72 | 1113 |
| 73 | 2113 |
| 74 | 3113 |
| 75 | 1213 |
| 76 | 2213 |
| 77 | 4213 |
| 78 | 1313 |
| 79 | 3313 |
| 80 | 4313 |
| 81 | 2413 |
| 82 | 3413 |
| 83 | 4413 |
| 84 | 1133 |
| 85 | 2133 |
| 86 | 3133 |
| 87 | 1233 |
| 88 | 2233 |
| 89 | 4233 |
| 90 | 1333 |

FIG. 19

| # | Code |
|---|---|
| 91 | 3333 |
| 92 | 4333 |
| 93 | 2433 |
| 94 | 3433 |
| 95 | 4433 |
| 96 | 1143 |
| 97 | 2143 |
| 98 | 3143 |
| 99 | 1243 |
| 100 | 2243 |
| 101 | 4243 |
| 102 | 1343 |
| 103 | 3343 |
| 104 | 4343 |
| 105 | 2443 |
| 106 | 3443 |
| 107 | 4443 |
| 108 | 1124 |
| 109 | 2124 |
| 110 | 3124 |
| 111 | 1224 |
| 112 | 2224 |
| 113 | 4224 |
| 114 | 1324 |
| 115 | 3324 |
| 116 | 4324 |
| 117 | 2424 |
| 118 | 3424 |
| 119 | 4424 |
| 120 | 1134 |

| # | Code |
|---|---|
| 121 | 2134 |
| 122 | 3134 |
| 123 | 1234 |
| 124 | 2234 |
| 125 | 4234 |
| 126 | 1334 |
| 127 | 3334 |
| 128 | 4334 |
| 129 | 2434 |
| 130 | 3434 |
| 131 | 4434 |
| 132 | 1144 |
| 133 | 2144 |
| 134 | 3144 |
| 135 | 1244 |
| 136 | 2244 |
| 137 | 4244 |
| 138 | 1344 |
| 139 | 3344 |
| 140 | 4344 |
| 141 | 2444 |
| 142 | 3444 |
| 143 | 4444 |
| 144 | 0111 |
| 145 | 0211 |
| 146 | 0311 |
| 147 | 0411 |
| 148 | 0121 |
| 149 | 0221 |
| 150 | 0321 |

| # | Code |
|---|---|
| 151 | 0421 |
| 152 | 0131 |
| 153 | 0231 |
| 154 | 0331 |
| 155 | 0431 |
| 156 | 0112 |
| 157 | 0212 |
| 158 | 0312 |
| 159 | 0412 |
| 160 | 0122 |
| 161 | 0222 |
| 162 | 0322 |
| 163 | 0422 |
| 164 | 0142 |
| 165 | 0242 |
| 166 | 0342 |
| 167 | 0442 |
| 168 | 0113 |
| 169 | 0213 |
| 170 | 0313 |
| 171 | 0413 |
| 172 | 0133 |
| 173 | 0233 |
| 174 | 0333 |
| 175 | 0433 |
| 176 | 0143 |
| 177 | 0243 |
| 178 | 0343 |
| 179 | 0443 |
| 180 | 0124 |

FIG. 20

| | | | |
|---|---|---|---|
| 181 | 0224 | 211 | 4022 |
| 182 | 0324 | 212 | 1042 |
| 183 | 0424 | 213 | 2042 |
| 184 | 0134 | 214 | 3042 |
| 185 | 0234 | 215 | 4042 |
| 186 | 0334 | 216 | 1013 |
| 187 | 0434 | 217 | 2013 |
| 188 | 0144 | 218 | 3013 |
| 189 | 0244 | 219 | 4013 |
| 190 | 0344 | 220 | 1033 |
| 191 | 0444 | 221 | 2033 |
| 192 | 1011 | 222 | 3033 |
| 193 | 2011 | 223 | 4033 |
| 194 | 3011 | 224 | 1043 |
| 195 | 4011 | 225 | 2043 |
| 196 | 1021 | 226 | 3043 |
| 197 | 2021 | 227 | 4043 |
| 198 | 3021 | 228 | 1024 |
| 199 | 4021 | 229 | 2024 |
| 200 | 1031 | 230 | 3024 |
| 201 | 2031 | 231 | 4024 |
| 202 | 3031 | 232 | 1034 |
| 203 | 4031 | 233 | 2034 |
| 204 | 1012 | 234 | 3034 |
| 205 | 2012 | 235 | 4034 |
| 206 | 3012 | 236 | 1044 |
| 207 | 4012 | 237 | 2044 |
| 208 | 1022 | 238 | 3044 |
| 209 | 2022 | 239 | 4044 |
| 210 | 3022 | 240 | 0011 |

| | |
|---|---|
| 241 | 0021 |
| 242 | 0031 |
| 243 | 0012 |
| 244 | 0022 |
| 245 | 0042 |
| 246 | 0013 |
| 247 | 0033 |
| 248 | 0043 |
| 249 | 0024 |
| 250 | 0034 |
| 251 | 0044 |
| 252 | 1101 |
| 253 | 2101 |
| 254 | 3101 |
| 255 | 1201 |
| 256 | 2201 |
| 257 | 4201 |
| 258 | 1301 |
| 259 | 3301 |
| 260 | 4301 |
| 261 | 2401 |
| 262 | 3401 |
| 263 | 4401 |
| 264 | 1102 |
| 265 | 2102 |
| 266 | 3102 |
| 267 | 1202 |
| 268 | 2202 |
| 269 | 4202 |
| 270 | 1302 |

FIG. 21

| | | | | | |
|---|---|---|---|---|---|
| 271 | 3302 | 301 | 0201 | 331 | 4004 |
| 272 | 4302 | 302 | 0301 | 332 | 0001 |
| 273 | 2402 | 303 | 0401 | 333 | 0002 |
| 274 | 3402 | 304 | 0102 | 334 | 0003 |
| 275 | 4402 | 305 | 0202 | 335 | 0004 |
| 276 | 1103 | 306 | 0302 | 336 | 2223 |
| 277 | 2103 | 307 | 0402 | 337 | 4223 |
| 278 | 3103 | 308 | 0103 | 338 | 2423 |
| 279 | 1203 | 309 | 0203 | 339 | 3423 |
| 280 | 2203 | 310 | 0303 | 340 | 4423 |
| 281 | 4203 | 311 | 0403 | 341 | 1114 |
| 282 | 1303 | 312 | 0104 | 342 | 2114 |
| 283 | 3303 | 313 | 0204 | 343 | 3114 |
| 284 | 4303 | 314 | 0304 | 344 | 1214 |
| 285 | 2403 | 315 | 0404 | 345 | 2214 |
| 286 | 3403 | 316 | 1001 | 346 | 4214 |
| 287 | 4403 | 317 | 2001 | 347 | 1314 |
| 288 | 1104 | 318 | 3001 | 348 | 3314 |
| 289 | 2104 | 319 | 4001 | 349 | 4314 |
| 290 | 3104 | 320 | 1002 | 350 | 0241 |
| 291 | 1204 | 321 | 2002 | 351 | 0341 |
| 292 | 2204 | 322 | 3002 | 352 | 0441 |
| 293 | 4204 | 323 | 4002 | 353 | 0132 |
| 294 | 1304 | 324 | 1003 | 354 | 0332 |
| 295 | 3304 | 325 | 2003 | 355 | 0432 |
| 296 | 4304 | 326 | 3003 | 356 | 0123 |
| 297 | 2404 | 327 | 4003 | 357 | 0223 |
| 298 | 3404 | 328 | 1004 | 358 | 0423 |
| 299 | 4404 | 329 | 2004 | 359 | 0114 |
| 300 | 0101 | 330 | 3004 | 360 | 0214 |

FIG. 22

| | |
|---|---|
| 361 | 0314 |
| 362 | 1041 |
| 363 | 2041 |
| 364 | 3041 |
| 365 | 4041 |
| 366 | 1032 |
| 367 | 2032 |
| 368 | 3032 |
| 369 | 4032 |
| 370 | 1023 |
| 371 | 2023 |
| 372 | 3023 |
| 373 | 4023 |
| 374 | 1014 |
| 375 | 2014 |
| 376 | 3014 |
| 377 | 4014 |
| 378 | 0041 |
| 379 | 0032 |
| 380 | 0023 |
| 381 | 0014 |
| 382 | 4131 |
| 383 | 2331 |
| 384 | 1431 |
| 385 | 4112 |
| 386 | 3212 |
| 387 | 2312 |
| 388 | 4122 |
| 389 | 3222 |
| 390 | 1422 |

| | |
|---|---|
| 391 | 3242 |
| 392 | 2342 |
| 393 | 1442 |
| 394 | 4113 |
| 395 | 3213 |
| 396 | 2313 |
| 397 | 4133 |
| 398 | 2333 |
| 399 | 1433 |
| 400 | 3243 |
| 401 | 2343 |
| 402 | 1443 |
| 403 | 4124 |
| 404 | 3224 |
| 405 | 1424 |
| 406 | 4134 |
| 407 | 2334 |
| 408 | 1434 |
| 409 | 3244 |
| 410 | 2344 |
| 411 | 1444 |
| 412 | 4101 |
| 413 | 3201 |
| 414 | 2301 |
| 415 | 1401 |
| 416 | 4102 |
| 417 | 3202 |
| 418 | 2302 |
| 419 | 1402 |
| 420 | 4103 |

| | |
|---|---|
| 421 | 3203 |
| 422 | 2303 |
| 423 | 1403 |
| 424 | 4104 |
| 425 | 3204 |
| 426 | 2304 |
| 427 | 1404 |
| 428 | 1110 |
| 429 | 2110 |
| 430 | 3110 |
| 431 | 1210 |
| 432 | 2210 |
| 433 | 4210 |
| 434 | 1310 |
| 435 | 3310 |
| 436 | 4310 |
| 437 | 2410 |
| 438 | 3410 |
| 439 | 4410 |
| 440 | 1120 |
| 441 | 2120 |
| 442 | 3120 |
| 443 | 1220 |
| 444 | 2220 |
| 445 | 4220 |
| 446 | 1320 |
| 447 | 3320 |
| 448 | 4320 |
| 449 | 2420 |
| 450 | 3420 |

FIG. 23

| # | Code | # | Code |
|---|------|---|------|
| 451 | 4420 | 481 | 0220 |
| 452 | 1130 | 482 | 0320 |
| 453 | 2130 | 483 | 0420 |
| 454 | 3130 | 484 | 0130 |
| 455 | 1230 | 485 | 0230 |
| 456 | 2230 | 486 | 0330 |
| 457 | 4230 | 487 | 0430 |
| 458 | 1330 | 488 | 0140 |
| 459 | 3330 | 489 | 0240 |
| 460 | 4330 | 490 | 0340 |
| 461 | 2430 | 491 | 0440 |
| 462 | 3430 | 492 | 1010 |
| 463 | 4430 | 493 | 2010 |
| 464 | 1140 | 494 | 3010 |
| 465 | 2140 | 495 | 4010 |
| 466 | 3140 | 496 | 1020 |
| 467 | 1240 | 497 | 2020 |
| 468 | 2240 | 498 | 3020 |
| 469 | 4240 | 499 | 4020 |
| 470 | 1340 | 500 | 1030 |
| 471 | 3340 | 501 | 2030 |
| 472 | 4340 | 502 | 3030 |
| 473 | 2440 | 503 | 4030 |
| 474 | 3440 | 504 | 1040 |
| 475 | 4440 | 505 | 2040 |
| 476 | 0110 | 506 | 3040 |
| 477 | 0210 | 507 | 4040 |
| 478 | 0310 | 508 | 0010 |
| 479 | 0410 | 509 | 0020 |
| 480 | 0120 | 510 | 0030 |
|   |      | 511 | 0040 |

FIG. 28

| CODE LENGTH n (CELL) | THE NUMBER OF SYMBOLS Ns | $\log_2(N_s)$ | BIT LENGTH B OF BINARY DATA | CODE RATE R (=B/n) | CODING EFFICIENCY Ef |
|---|---|---|---|---|---|
| 2 | 15 | 3.906891 | 3 | 1.5 | 75% |
| 3 | 60 | 5.906891 | 5 | 1.666667 | 83% |
| 4 | 240 | 7.906891 | 7 | 1.75 | 88% |
| 5 | 960 | 9.906891 | 9 | 1.8 | 90% |
| 6 | 3837 | 11.90576 | 11 | 1.833333 | 92% |
| 7 | 15345 | 13.90548 | 13 | 1.857143 | 93% |
| 8 | 61371 | 15.90527 | 15 | 1.875 | 94% |
| 9 | 245439 | 17.905 | 17 | 1.888889 | 94% |
| 10 | 981576 | 19.90474 | 19 | 1.9 | 95% |
| 11 | 3925584 | 21.90448 | 21 | 1.909091 | 95% |
| 12 | 15699456 | 23.90421 | 23 | 1.916667 | 96% |
| 13 | 62786313 | 25.90395 | 25 | 1.923077 | 96% |

| MULTILEVEL EDGE CODE | INITIAL STATE | | | | | FINAL STATE |
|---|---|---|---|---|---|---|
| 11111 | s0 | s0 | s0 | s0 | s0 | s0 |
| 21111 | s0 | s0 | s0 | s0 | s0 | s0 |
| 12111 | s0 | s0 | s0 | s0 | s0 | s0 |
| 32111 | s0 | s0 | s0 | s0 | s0 | s0 |
| ... | ... | | | | | |
| 00001 | s0 | s1 | s2 | s3 | s4 | s0 |
| 00002 | s0 | s1 | s2 | s3 | s4 | s0 |
| 00003 | s0 | s1 | s2 | s3 | s4 | s0 |

B

| MULTILEVEL EDGE CODE | INITIAL STATE | | | | | FINAL STATE |
|---|---|---|---|---|---|---|
| 11111 | s1 | s0 | s0 | s0 | s0 | s0 |
| 21111 | s1 | s0 | s0 | s0 | s0 | s0 |
| 12111 | s1 | s0 | s0 | s0 | s0 | s0 |
| 32111 | s1 | s0 | s0 | s0 | s0 | s0 |
| ... | ... | | | | | |
| 00001 | s1 | s2 | s3 | s4 | s5 | s0 |
| 00002 | s1 | s2 | s3 | s4 | s5 | s0 |
| 00003 | s1 | s2 | s3 | s4 | s5 | s0 |

| MULTILEVEL EDGE CODE | INITIAL STATE | | | | | | FINAL STATE |
|---|---|---|---|---|---|---|---|
| 11110 | S0 | S0 | S0 | S0 | S0 | → | S1 |
| 21110 | S0 | S0 | S0 | S0 | S0 | | S1 |
| 12110 | S0 | S0 | S0 | S0 | S0 | | S1 |
| 32110 | S0 | S0 | S0 | S0 | S0 | | S1 |
| ⋮ | ⋮ | | | | | | |
| 00010 | S0 | S1 | S2 | S0 | S0 | | S1 |
| 00020 | S0 | S1 | S2 | S3 | S0 | | S1 |
| 00030 | S0 | S1 | S2 | S3 | S0 | | S1 |

B

| MULTILEVEL EDGE CODE | INITIAL STATE | | | | | | FINAL STATE |
|---|---|---|---|---|---|---|---|
| 11110 | S1 | S0 | S0 | S0 | S0 | → | S1 |
| 21110 | S1 | S0 | S0 | S0 | S0 | | S1 |
| 12110 | S1 | S0 | S0 | S0 | S0 | | S1 |
| 32110 | S1 | S0 | S0 | S0 | S0 | | S1 |
| ⋮ | ⋮ | | | | | | |
| 00010 | S1 | S2 | S3 | S4 | S0 | | S1 |
| 00020 | S1 | S2 | S3 | S4 | S0 | | S1 |
| 00030 | S1 | S2 | S3 | S4 | S0 | | S1 |

| START CONTINUOUS LENGTH \ TERMINATION CONTINUOUS LENGTH | 0 | 1 | 2 | 3 | 4 |
|---|---|---|---|---|---|
| 0 | 468 | 117 | 30 | 9 | 3 |
| 1 | 81 | 21 | 6 | 0 | 0 |
| 2 | 21 | 6 | 0 | 0 | 0 |
| 3 | 6 | 0 | 0 | 0 | 0 |
| 4 | 0 | 0 | 0 | 0 | 0 |

B

| START CONTINUOUS LENGTH \ TERMINATION CONTINUOUS LENGTH | 0 | 1 | 2 | 3 | 4 |
|---|---|---|---|---|---|
| 0 | 156 | 0 | 0 | 0 | 0 |
| 1 | 27 | 0 | 0 | 0 | 0 |
| 2 | 6 | 0 | 0 | 0 | 0 |
| 3 | 3 | 0 | 0 | 0 | 0 |
| 4 | 0 | 0 | 0 | 0 | 0 |

FIG. 35

| BINARY DATA (DECIMAL) | MULTILEVEL EDGE CODE (5CELL) |
|---|---|
| 0 | 11111 |
| 1 | 21111 |
| 2 | 12111 |
| 3 | 11211 |
| 4 | 12211 |
| 5 | 11121 |
| 6 | 12121 |
| 7 | 11221 |
| 8 | 11112 |
| 9 | 21112 |
| 10 | 12112 |
| 11 | 01111 |
| 12 | 02111 |
| 13 | 03111 |
| 14 | 01211 |
| 15 | 02211 |
| 16 | 03211 |
| 17 | 02311 |
| 18 | 03311 |
| 19 | 01121 |
| 20 | 02121 |
| 21 | 03121 |
| 22 | 01221 |
| 23 | 03221 |
| 24 | 01321 |
| 25 | 02321 |
| 26 | 03321 |
| 27 | 01112 |
| 28 | 02112 |
| 29 | 03112 |
| 30 | 01212 |

| | |
|---|---|
| 31 | 02212 |
| 32 | 03212 |
| 33 | 02312 |
| 34 | 03312 |
| 35 | 01132 |
| 36 | 02132 |
| 37 | 01232 |
| 38 | 02232 |
| 39 | 03232 |
| 40 | 01332 |
| 41 | 02332 |
| 42 | 03332 |
| 43 | 01123 |
| 44 | 02123 |
| 45 | 03123 |
| 46 | 01223 |
| 47 | 02223 |
| 48 | 03223 |
| 49 | 01323 |
| 50 | 02323 |
| 51 | 03323 |
| 52 | 01133 |
| 53 | 02133 |
| 54 | 01233 |
| 55 | 02233 |
| 56 | 03233 |
| 57 | 01333 |
| 58 | 02333 |
| 59 | 03333 |
| 59 | 10111 |
| 60 | 20111 |

| | |
|---|---|
| 61 | 30111 |
| 62 | 10211 |
| 63 | 20211 |
| 64 | 30211 |
| 65 | 10311 |
| 66 | 20311 |
| 67 | 30311 |
| 68 | 10121 |
| 69 | 20121 |
| 70 | 30121 |
| 71 | 10221 |
| 72 | 20221 |
| 73 | 30221 |
| 74 | 10321 |
| 75 | 20321 |
| 76 | 30321 |
| 77 | 10112 |
| 78 | 20112 |
| 79 | 30112 |
| 80 | 10212 |
| 81 | 20212 |
| 82 | 30212 |
| 83 | 10312 |
| 84 | 20312 |
| 85 | 30312 |
| 86 | 10132 |
| 87 | 20132 |
| 88 | 30132 |
| 89 | 10232 |
| 90 | 20232 |

*FIG. 36*

| | |
|---|---|
| 91 | 30232 |
| 92 | 10332 |
| 93 | 20332 |
| 94 | 30332 |
| 95 | 10123 |
| 96 | 20123 |
| 97 | 30123 |
| 98 | 10223 |
| 99 | 20223 |
| 100 | 30223 |
| 101 | 10323 |
| 102 | 20323 |
| 103 | 30323 |
| 104 | 10133 |
| 105 | 20133 |
| 106 | 30133 |
| 107 | 10233 |
| 108 | 20233 |
| 109 | 30233 |
| 110 | 10333 |
| 111 | 20333 |
| 112 | 30333 |
| 113 | 00111 |
| 114 | 00211 |
| 115 | 00311 |
| 116 | 00121 |
| 117 | 00221 |
| 118 | 00321 |
| 119 | 00112 |
| 120 | 00212 |

| | |
|---|---|
| 121 | 00312 |
| 122 | 00132 |
| 123 | 00232 |
| 124 | 00332 |
| 125 | 00123 |
| 126 | 00223 |
| 127 | 00323 |
| 128 | 00133 |
| 129 | 00233 |
| 130 | 00333 |
| 131 | 11011 |
| 132 | 21011 |
| 133 | 12011 |
| 134 | 32011 |
| 135 | 23011 |
| 136 | 33011 |
| 137 | 11021 |
| 138 | 21021 |
| 139 | 12021 |
| 140 | 32021 |
| 141 | 23021 |
| 142 | 33021 |
| 143 | 11012 |
| 144 | 21012 |
| 145 | 12012 |
| 146 | 32012 |
| 147 | 23012 |
| 148 | 33012 |
| 149 | 11032 |
| 150 | 21032 |

| | |
|---|---|
| 151 | 12032 |
| 152 | 32032 |
| 153 | 23032 |
| 154 | 33032 |
| 155 | 11023 |
| 156 | 21023 |
| 157 | 12023 |
| 158 | 32023 |
| 159 | 23023 |
| 160 | 33023 |
| 161 | 11033 |
| 162 | 21033 |
| 163 | 12033 |
| 164 | 32033 |
| 165 | 23033 |
| 166 | 33033 |
| 167 | 01011 |
| 168 | 02011 |
| 169 | 03011 |
| 170 | 01021 |
| 171 | 02021 |
| 172 | 03021 |
| 173 | 01012 |
| 174 | 02012 |
| 175 | 03012 |
| 176 | 01032 |
| 177 | 02032 |
| 178 | 03032 |
| 179 | 01023 |
| 180 | 02023 |

FIG. 37

| # | Code |
|---|---|
| 181 | 03023 |
| 182 | 01033 |
| 183 | 02033 |
| 184 | 03033 |
| 185 | 10011 |
| 186 | 20011 |
| 187 | 30011 |
| 188 | 10021 |
| 189 | 20021 |
| 190 | 30021 |
| 191 | 10012 |
| 192 | 20012 |
| 193 | 30012 |
| 194 | 10032 |
| 195 | 20032 |
| 196 | 30032 |
| 197 | 10023 |
| 198 | 20023 |
| 199 | 30023 |
| 200 | 10033 |
| 201 | 20033 |
| 202 | 30033 |
| 203 | 00011 |
| 204 | 00021 |
| 205 | 00012 |
| 206 | 00032 |
| 207 | 00023 |
| 208 | 00033 |
| 209 | 11101 |
| 210 | 21101 |

| # | Code |
|---|---|
| 211 | 12101 |
| 212 | 32101 |
| 213 | 23101 |
| 214 | 33101 |
| 215 | 11201 |
| 216 | 21201 |
| 217 | 12201 |
| 218 | 32201 |
| 219 | 23201 |
| 220 | 33201 |
| 221 | 11301 |
| 222 | 21301 |
| 223 | 12301 |
| 224 | 32301 |
| 225 | 23301 |
| 226 | 33301 |
| 227 | 11102 |
| 228 | 21102 |
| 229 | 12102 |
| 230 | 32102 |
| 231 | 23102 |
| 232 | 33102 |
| 233 | 11202 |
| 234 | 21202 |
| 235 | 12202 |
| 236 | 32202 |
| 237 | 23202 |
| 238 | 33202 |
| 239 | 11302 |
| 240 | 21302 |

| # | Code |
|---|---|
| 241 | 12302 |
| 242 | 32302 |
| 243 | 23302 |
| 244 | 33302 |
| 245 | 11103 |
| 246 | 21103 |
| 247 | 12103 |
| 248 | 32103 |
| 249 | 23103 |
| 250 | 33103 |
| 251 | 11203 |
| 252 | 21203 |
| 253 | 12203 |
| 254 | 32203 |
| 255 | 23203 |
| 256 | 33203 |
| 257 | 11303 |
| 258 | 21303 |
| 259 | 12303 |
| 260 | 32303 |
| 261 | 23303 |
| 262 | 33303 |
| 263 | 01101 |
| 264 | 02101 |
| 265 | 03101 |
| 266 | 01201 |
| 267 | 02201 |
| 268 | 03201 |
| 269 | 01301 |
| 270 | 02301 |

FIG. 38

| | |
|---|---|
| 271 | 03301 |
| 272 | 01102 |
| 273 | 02102 |
| 274 | 03102 |
| 275 | 01202 |
| 276 | 02202 |
| 277 | 03202 |
| 278 | 01302 |
| 279 | 02302 |
| 280 | 03302 |
| 281 | 01103 |
| 282 | 02103 |
| 283 | 03103 |
| 284 | 01203 |
| 285 | 02203 |
| 286 | 03203 |
| 287 | 01303 |
| 288 | 02303 |
| 289 | 03303 |
| 290 | 10101 |
| 291 | 20101 |
| 292 | 30101 |
| 293 | 10201 |
| 294 | 20201 |
| 295 | 30201 |
| 296 | 10301 |
| 297 | 20301 |
| 298 | 30301 |
| 299 | 10102 |
| 300 | 20102 |

| | |
|---|---|
| 301 | 30102 |
| 302 | 10202 |
| 303 | 20202 |
| 304 | 30202 |
| 305 | 10302 |
| 306 | 20302 |
| 307 | 30302 |
| 308 | 10103 |
| 309 | 20103 |
| 310 | 30103 |
| 311 | 10203 |
| 312 | 20203 |
| 313 | 30203 |
| 314 | 10303 |
| 315 | 20303 |
| 316 | 30303 |
| 317 | 00101 |
| 318 | 00201 |
| 319 | 00301 |
| 320 | 00102 |
| 321 | 00202 |
| 322 | 00302 |
| 323 | 00103 |
| 324 | 00203 |
| 325 | 00303 |
| 326 | 11001 |
| 327 | 21001 |
| 328 | 12001 |
| 329 | 32001 |
| 330 | 23001 |

| | |
|---|---|
| 331 | 33001 |
| 332 | 11002 |
| 333 | 21002 |
| 334 | 12002 |
| 335 | 32002 |
| 336 | 23002 |
| 337 | 33002 |
| 338 | 11003 |
| 339 | 21003 |
| 340 | 12003 |
| 341 | 32003 |
| 342 | 23003 |
| 343 | 33003 |
| 344 | 01001 |
| 345 | 02001 |
| 346 | 03001 |
| 347 | 01002 |
| 348 | 02002 |
| 349 | 03002 |
| 350 | 01003 |
| 351 | 02003 |
| 352 | 03003 |
| 353 | 10001 |
| 354 | 20001 |
| 355 | 30001 |
| 356 | 10002 |
| 357 | 20002 |
| 358 | 30002 |
| 359 | 10003 |
| 360 | 20003 |

FIG. 39

| # | Code | # | Code | # | Code |
|---|---|---|---|---|---|
| 361 | 30003 | 391 | 11320 | 421 | 01120 |
| 362 | 00001 | 392 | 21320 | 422 | 02120 |
| 363 | 00002 | 393 | 12320 | 423 | 03120 |
| 364 | 00003 | 394 | 32320 | 424 | 01220 |
| 365 | 11110 | 395 | 23320 | 425 | 03220 |
| 366 | 21110 | 396 | 33320 | 426 | 01320 |
| 367 | 12110 | 397 | 11130 | 427 | 02320 |
| 368 | 32110 | 398 | 21130 | 428 | 03320 |
| 369 | 23110 | 399 | 12130 | 429 | 01130 |
| 370 | 33110 | 400 | 32130 | 430 | 02130 |
| 371 | 11210 | 401 | 11230 | 431 | 01230 |
| 372 | 21210 | 402 | 21230 | 432 | 02230 |
| 373 | 12210 | 403 | 12230 | 433 | 03230 |
| 374 | 32210 | 404 | 32230 | 434 | 01330 |
| 375 | 23210 | 405 | 23230 | 435 | 02330 |
| 376 | 33210 | 406 | 33230 | 436 | 03330 |
| 377 | 12310 | 407 | 11330 | 437 | 10110 |
| 378 | 32310 | 408 | 21330 | 438 | 20110 |
| 379 | 23310 | 409 | 12330 | 439 | 30110 |
| 380 | 33310 | 410 | 32330 | 440 | 10210 |
| 381 | 11120 | 411 | 23330 | 441 | 20210 |
| 382 | 21120 | 412 | 33330 | 442 | 30210 |
| 383 | 12120 | 413 | 01110 | 443 | 10310 |
| 384 | 32120 | 414 | 02110 | 444 | 20310 |
| 385 | 23120 | 415 | 03110 | 445 | 30310 |
| 386 | 33120 | 416 | 01210 | 446 | 10120 |
| 387 | 11220 | 417 | 02210 | 447 | 20120 |
| 388 | 21220 | 418 | 03210 | 448 | 30120 |
| 389 | 23220 | 419 | 02310 | 449 | 10220 |
| 390 | 33220 | 420 | 03310 | 450 | 20220 |

FIG. 40

| | |
|---|---|
| 451 | 30220 |
| 452 | 10320 |
| 453 | 20320 |
| 454 | 30320 |
| 455 | 10130 |
| 456 | 20130 |
| 457 | 30130 |
| 458 | 10230 |
| 459 | 20230 |
| 460 | 30230 |
| 461 | 10330 |
| 462 | 20330 |
| 463 | 30330 |
| 464 | 00110 |
| 465 | 00210 |
| 466 | 00310 |
| 467 | 00120 |
| 468 | 00220 |
| 469 | 00320 |
| 470 | 00130 |
| 471 | 00230 |
| 472 | 00330 |
| 473 | 11010 |
| 474 | 21010 |
| 475 | 12010 |
| 476 | 32010 |
| 477 | 23010 |
| 478 | 33010 |
| 479 | 11020 |
| 480 | 21020 |

| | |
|---|---|
| 481 | 12020 |
| 482 | 32020 |
| 483 | 23020 |
| 484 | 33020 |
| 485 | 11030 |
| 486 | 21030 |
| 487 | 12030 |
| 488 | 32030 |
| 489 | 23030 |
| 490 | 33030 |
| 491 | 01010 |
| 492 | 02010 |
| 493 | 03010 |
| 494 | 01020 |
| 495 | 02020 |
| 496 | 03020 |
| 497 | 01030 |
| 498 | 02030 |
| 499 | 03030 |
| 500 | 10010 |
| 501 | 20010 |
| 502 | 30010 |
| 503 | 10020 |
| 504 | 20020 |
| 505 | 30020 |
| 506 | 10030 |
| 507 | 20030 |
| 508 | 30030 |
| 509 | 00010 |
| 510 | 00020 |
| 511 | 00030 |

RECORDING APPARATUS, RECORDING METHOD, REPRODUCTION APPARATUS, REPRODUCTION METHOD, RECORDING MEDIUM, ENCODING APPARATUS, AND DECODING APPARATUS

CROSS REFERENCE TO PRIOR APPLICATION

This application is a National Stage Patent Application of PCT International Patent Application No. PCT/JP2019/040573 (filed on Oct. 16, 2019) under 35 U.S.C. § 371, which claims priority to Japanese Patent Application No. 2018-202533 (filed on Oct. 29, 2018), which are all hereby incorporated by reference in their entirety.

TECHNICAL FIELD

The present technology relates to a recording apparatus, a recording method, a reproduction apparatus, a reproduction method, a recording medium, an encoding apparatus, and a decoding apparatus, and more particularly, to, for example, a recording apparatus, a recording method, a reproduction apparatus, a reproduction method, a recording medium, an encoding apparatus, and a decoding apparatus which enable recording or reproduction to be easily implemented at high line density.

BACKGROUND ART

A technology of recording and reproducing a multilevel code of an ML value which can assume equal to or greater than 3 has been proposed (see, for example, Patent Document 1).

CITATION LIST

Patent Document

Patent Document 1: U.S. Pat. No. 6,385,255

SUMMARY OF THE INVENTION

Problems to be Solved by the Invention

It is desired to easily implement recording and reproduction at high line density in recording and reproduction of a multilevel code.

The present technology has been made in view of such circumstances and is directed to enabling recording and reproduction to be easily implemented at high line density.

Solutions to Problems

A recording apparatus according to the present technology is a recording apparatus including an encoding unit configured to encode user data into a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of a multilevel code of an ML value which is equal to or greater than 3, and which generates the multilevel edge code expressing the multilevel code with the edge by state transition of transitioning to a state representing the number of times that zero is consecutive including 0 in a case where 0 is output and transitioning to a state representing that the number of times that zero is consecutive is 0 times in a case where one of 1 to ML−1 is output, and a recording unit configured to record the multilevel code whose value changes in accordance with the multilevel edge code in a recording medium.

A recording method according to the present technology is a recording method including encoding user data into a multilevel edge code generated through state transition of a code generation model which includes a state representing a number of times that zero is consecutive corresponding to a number of ways of the number of times that zero is consecutive that an edge of zero is consecutive among edges representing a change amount from an immediately preceding value of a multilevel code of an ML value which is equal to or greater than 3, and which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output, and recording the multilevel code whose value changes in accordance with the multilevel edge code in a recording medium.

In the recording apparatus and the recording method according to the present technology, user data is encoded into a multilevel edge code generated through state transition of a code generation model which includes a state representing a number of times that zero is consecutive corresponding to a number of ways of the number of times that zero is consecutive that an edge of zero is consecutive among edges representing a change amount from an immediately preceding value of a multilevel code of an ML value which is equal to or greater than 3, and which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output, and the multilevel code whose value changes in accordance with the multilevel edge code is recorded in a recording medium.

A reproduction apparatus according to the present technology is a reproduction apparatus including a reproducing unit configured to reproduce from a recording medium, a multilevel code whose value changes in accordance with a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output, and a decoding unit configured to decode the multilevel code.

A reproduction method according to the present technology is a reproduction method including reproducing from a recording medium, a multilevel code whose value changes in accordance with a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output, and decoding the multilevel code.

In the reproduction apparatus and the reproduction method according to the present technology, a multilevel code is reproduced from a recording medium and decoded, the multilevel code having a value which changes in accordance with a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output, and transitioning to a state representing that the number of times that zero is consecutive is 0 times in a case where one of 1 to ML−1 is output.

A recording medium according to the present technology is a recording medium in which a multilevel code is recorded, the multilevel code having a value which changes in accordance with a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output, and transitioning to a state representing that the number of times that zero is consecutive is 0 times in a case where one of 1 to ML−1 is output.

In the recording medium according to the present technology, a multilevel code is recorded, the multilevel code having a value which changes in accordance with a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output, and transitioning to a state representing that the number of times that zero is consecutive is 0 times in a case where one of 1 to ML−1 is output.

An encoding apparatus according to the present technology is an encoding apparatus including an encoding unit configured to encode user data into a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

In the encoding apparatus according to the present technology, user data is encoded into a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

A decoding apparatus according to the present technology is a decoding apparatus including a decoding unit configured to decode a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

In the decoding apparatus according to the present technology, a multilevel edge code is decoded, the multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

The recording apparatus, the reproduction apparatus, an encoding apparatus, and a decoding apparatus may be independent apparatuses (including modules and semiconductor chips) or may be internal blocks which constitute one apparatus.

Further, the recording apparatus, the reproduction apparatus, the encoding apparatus, and the decoding apparatus can be implemented by causing a computer to execute programs. The programs can be distributed by being recorded in a recording medium or by being transmitted via a transmission medium.

BRIEF DESCRIPTION OF DRAWINGS

FIG. 11 is a diagram illustrating specifications of a block code constituted with multilevel codes for which ML=5 in a case where the maximum number of consecutive times k=4.

FIG. 13 is a diagram illustrating 500 s0→s0 codes and 500 s1→s0 codes and part of state transition in a case where the s0→s0 codes and the s1→s0 codes are generated.

FIG. 14 is a diagram illustrating 100 s0→s1 codes and 100 s1→s1 codes and part of state transition in a case where the s0→s1 codes and the s1→s1 codes are generated.

FIG. 17 is a diagram illustrating a start continuous length and a termination continuous length for 500 s0→s0 codes and 100 s0→s1 codes which are 600 candidate codes for 9 bit/4 cell codes for which k=4 and ML=5.

FIG. 18 is a diagram illustrating an example of a code LUT in which 512 block codes are registered as 9 bit/4 cell codes for which k=4 and ML=5.

FIG. 19 is a diagram illustrating an example of a code LUT in which 512 block codes are registered as 9 bit/4 cell codes for which k=4 and ML=5.

FIG. 20 is a diagram illustrating an example of a code LUT in which 512 block codes are registered as 9 bit/4 cell codes for which k=4 and ML=5.

FIG. 21 is a diagram illustrating an example of a code LUT in which 512 block codes are registered as 9 bit/4 cell codes for which k=4 and ML=5.

FIG. 22 is a diagram illustrating an example of a code LUT in which 512 block codes are registered as 9 bit/4 cell codes for which k=4 and ML=5.

FIG. 23 is a diagram illustrating an example of a code LUT in which 512 block codes are registered as 9 bit/4 cell codes for which k=4 and ML=5.

FIG. 28 is a diagram illustrating specifications of a block code constituted with multilevel codes for which ML=4 in a case where the maximum number of consecutive times k=5.

FIG. 30 is a diagram illustrating 768 s0→s0 codes and 768 s1→s0 codes and part of state transition in a case where the s0→s0 codes and the s1→s0 codes are generated.

FIG. 31 is a diagram illustrating 192 s0→s1 codes and 192 s1→s1 codes and part of state transition in a case where the s0→s1 codes and the s1→s1 codes are generated.

FIG. 34 is a diagram illustrating a start continuous length and a termination continuous length for 768 s0→s0 codes and 192 s0→s1 codes which are 960 candidate codes for 9 bit/5 cell codes for which k=5 and ML=4.

FIG. 35 is a diagram illustrating an example of a code LUT in which 512 block codes are registered as 9 bit/5 cell codes for which k=5 and ML=4.

FIG. 36 is a diagram illustrating an example of a code LUT in which 512 block codes are registered as 9 bit/5 cell codes for which k=5 and ML=4.

FIG. 37 is a diagram illustrating an example of a code LUT in which 512 block codes are registered as 9 bit/5 cell codes for which k=5 and ML=4.

FIG. 38 is a diagram illustrating an example of a code LUT in which 512 block codes are registered as 9 bit/5 cell codes for which k=5 and ML=4.

FIG. 39 is a diagram illustrating an example of a code LUT in which 512 block codes are registered as 9 bit/5 cell codes for which k=5 and ML=4.

FIG. 40 is a diagram illustrating an example of a code LUT in which 512 block codes are registered as 9 bit/5 cell codes for which k=5 and ML=4.

MODE FOR CARRYING OUT THE INVENTION

<Embodiment of Recording and Reproduction Apparatus to which the Present Technology is Applied>

Figure 1:
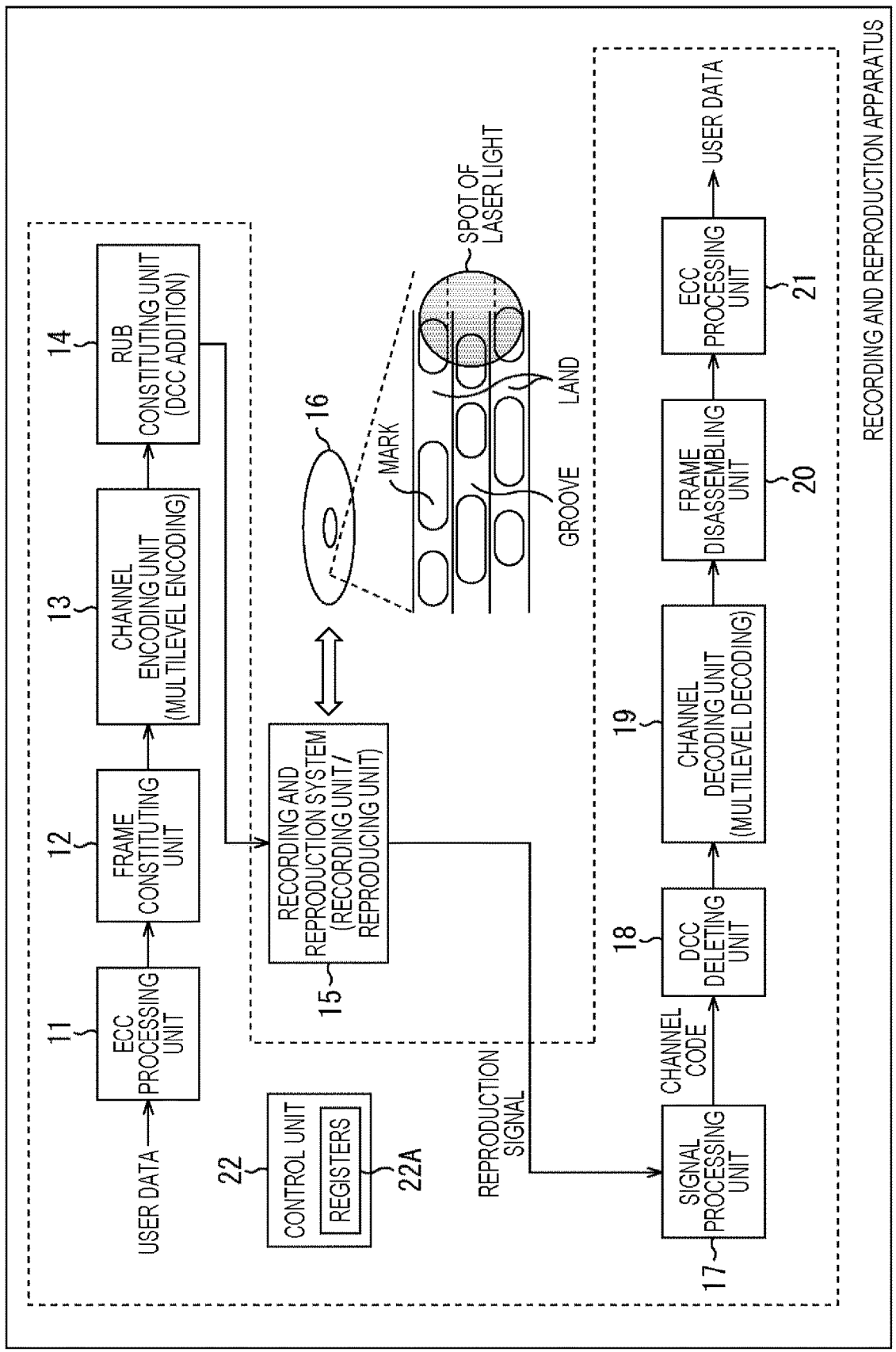
FIG. 1 is a block diagram illustrating a configuration example of an embodiment of a recording and reproduction apparatus to which the present technology is applied.

FIG. 1 is a block diagram illustrating a configuration example of an embodiment of a recording and reproduction apparatus to which the present technology is applied.

In FIG. 1, the recording and reproduction apparatus includes an error correction coding (ECC) processing unit 11, a frame constituting unit 12, a channel encoding unit 13, a recording unit block (RUB) constituting unit 14, a recording and reproduction system 15, an optical disk 16, a signal processing unit 17, a DCC deleting unit 18, a channel decoding unit 19, a frame disassembling unit 20, an ECC processing unit 21, and a control unit 22.

User data (content such as an image and a speech, a computer program, other various kinds of data) which is to be recorded in the optical disk 16 is supplied to the ECC processing unit 11.

The ECC processing unit 11 constitutes ECC target data which includes user data of a predetermined unit and which is to be subjected to ECC processing, for each predetermined unit of the user data.

Further, the ECC processing unit 11 constitutes an ECC block by performing ECC processing of adding parity on the ECC target data and supplies the ECC block to the frame constituting unit 12.

The frame constituting unit 12 constitutes a frame by dividing the ECC block from the ECC processing unit 11 into row data as data of a predetermined unit and adding necessary data such as a frame sync (FS) representing a head (or a tail) of the frame to the row data and supplies the frame to the channel encoding unit 13.

The channel encoding unit 13 encodes the frame from the frame constituting unit 12 into a predetermined channel code and supplies the channel code to the RUB constituting unit 14.

Here, for example, (multilevel edge codes expressing) multilevel codes which are one type of multilevel codes of an ML value which assumes equal to or greater than 3, and which is generated through state transition of a code generation model which will be described later can be employed as the channel code.

The RUB constituting unit 14 constitutes an RUB as a recording block which becomes a unit of recording in the optical disk 16 by adding Run_in and Run_out respectively representing start and end of an ECC block to an aggregate of frames (frames encoded into channel codes) from the channel encoding unit 13 and adding (inserting) a direct current control (DCC) code for direct current (DC) control and supplies the RUB to the recording and reproduction system 15.

The recording and reproduction system 15 is constituted with a pickup, or the like, which is not illustrated. The recording and reproduction system 15 functions as a recording unit which records data in the optical disk 16 by irradiating the optical disk 16 with light such as laser light to form a mark. Further, the recording and reproduction system 15 functions as a reproducing unit which reproduces data recorded in the optical disk 16 by irradiating the optical disk 16 with laser light, receiving reflected light of the laser light from the optical disk 16 and outputting a reproduction signal in accordance with the reflected light.

The recording and reproduction system 15 irradiates the optical disk 16 with laser light in accordance with the RUB from the RUB constituting unit 14 and records the RUB in the optical disk 16. Further, the recording and reproduction system 15 reproduces a reproduction signal (radio frequency (RF) signal) corresponding to the RUB, or the like, recorded in the optical disk 16 by irradiating the optical disk 16 with laser light and supplies the reproduction signal to the signal processing unit 17.

The optical disk 16 is one type of disk-shaped recording media, in which lands (tracks) and grooves (tracks) are formed adjacent to each other as tracks.

The groove is a track which is a groove, and is, for example, wobbling for addressing. The land is a track put between (adjacent) two grooves.

To record data in the optical disk 16 at high line density, data is recorded (marks are formed) in both the lands and the grooves.

The signal processing unit 17 restores the frame of the channel code by performing signal processing on the reproduction signal from the recording and reproduction system 15 and supplies the frame to the DCC deleting unit 18.

The DCC deleting unit 18 deletes a DCC code from the frame from the signal processing unit 17 and supplies the frame after the DCC code is deleted to the channel decoding unit 19.

The channel decoding unit 19 performs decoding (channel decoding) of the multilevel code as the channel code included in the frame from the DCC deleting unit 18 through Viterbi decoding, or the like, for example, as maximum-likelihood decoding, and supplies the frame obtained through the decoding to the frame disassembling unit 20.

The frame disassembling unit 20 disassembles the frame from the channel decoding unit 19 and supplies the row data obtained as a result to the ECC processing unit 21.

The ECC processing unit 21 collects the row data from the frame disassembling unit 20 to constitute an ECC block. Further, the ECC processing unit 21 corrects an error occurring at the ECC target data included in the ECC block by performing ECC processing on the ECC block and outputs the user data included in the ECC target data.

The control unit 22 controls respective blocks which constitute the recording and reproduction apparatus. In other words, the control unit 22 incorporates registers 22A. In the registers 22A, for example, commands and other various kinds of information are stored (set) in accordance with operation, or the like, of an operating unit which is not illustrated. The control unit 22 controls the respective blocks which constitute the recording and reproduction apparatus in accordance with stored values (setting values) of the registers 22A.

Note that in FIG. 1, the recording and reproduction apparatus can be constituted as an apparatus dedicated for reproduction which performs only reproduction or as an apparatus dedicated for recording which performs only recording as well as being constituted as an apparatus which performs both reproduction and recording.

Further, in FIG. 1, the recording and reproduction apparatus can be also constituted as an apparatus which incorporates the optical disk 16 in advance or can be constituted as an apparatus from which the optical disk 16 is detachable.

Still further, components from the ECC processing unit 11 to the RUB constituting unit 14 and from the signal processing unit 17 to the control unit 22 which constitute the recording and reproduction apparatus in FIG. 1 can be constituted with one chip.

<Recording Processing>

Figure 2:
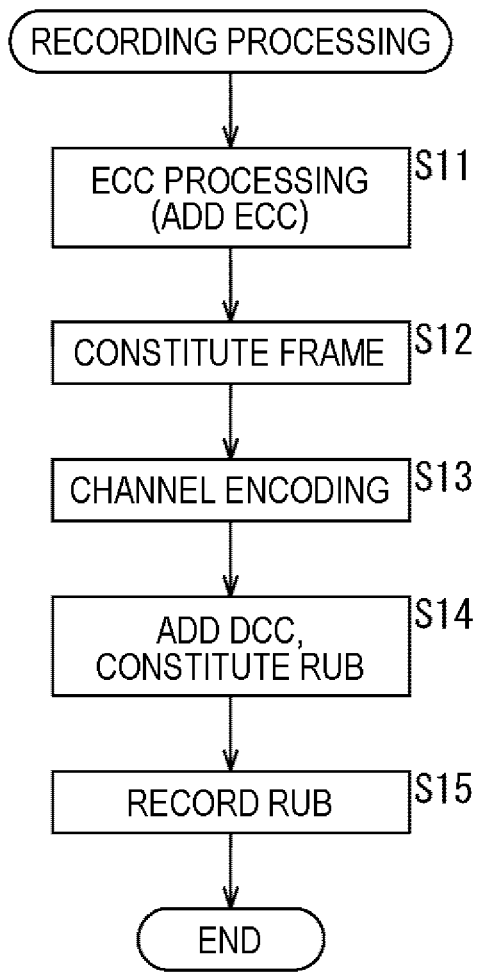
FIG. 2 is a flowchart for explaining an example of recording processing of the recording and reproduction apparatus recording user data in an optical disk 16.

FIG. 2 is a flowchart for explaining an example of recording processing of the recording and reproduction apparatus in FIG. 1 recording user data in an optical disk 16.

In step S11, the ECC processing unit 11 constitutes ECC target data including user data using the user data supplied to the ECC processing unit 11. Further, the ECC processing unit 11 constitutes an ECC block in which parity is added to the ECC target data by performing ECC processing on the ECC target data and supplies the ECC block to the frame constituting unit 12, and the processing proceeds from step S11 to step S12.

In step S12, the frame constituting unit 12 constitutes a frame by dividing the ECC block from the ECC processing unit 11 into row data and adding necessary data such as frame sync (FS) to respective pieces of the row data.

The frame constituting unit 12 supplies the frame to the channel encoding unit 13, and the processing proceeds from step S12 to step S13.

In step S13, the channel encoding unit 13 encodes the frame from the frame constituting unit 12 into a multilevel code (multilevel edge code) as a channel code and supplies the multilevel code to the RUB constituting unit 14, and the processing proceeds to step S14.

In step S14, the RUB constituting unit 14 constitutes an RUB by receiving the frame from the channel encoding unit 13, for example, collecting frames obtained from one ECC block, adding Run_in and Run_out to an aggregate of the frames and adding a DCC code. The RUB constituting unit 14 supplies the RUB to the recording and reproduction system 15, and the processing proceeds from step S14 to step S15.

In step S15, the recording and reproduction system 15 records the RUB in the optical disk 16 by irradiating the optical disk 16 with laser light in accordance with the RUB from the RUB constituting unit 14.

The user data is recorded in the optical disk 16 in units of RUB by similar processing being performed hereinafter. In other words, recording in the optical disk 16 is performed in units of RUB.

<Reproduction Processing>

Figure 3:
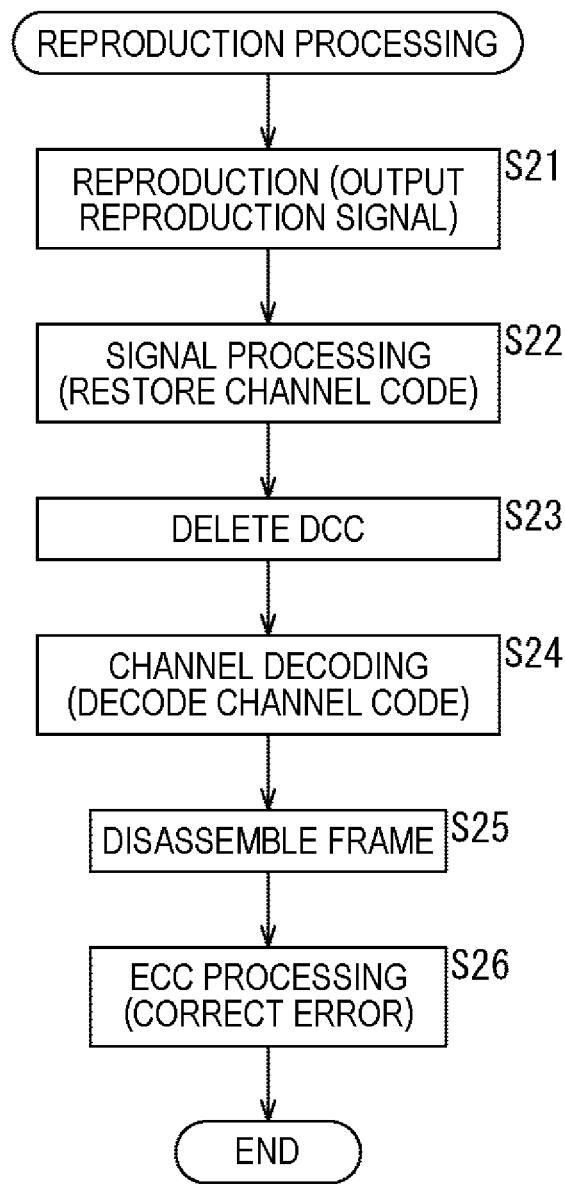
FIG. 3 is a flowchart for explaining an example of reproduction processing of the recording and reproduction apparatus reproducing user data recorded in the optical disk 16.

FIG. 3 is a flowchart for explaining an example of reproduction processing of the recording and reproduction apparatus in FIG. 1 reproducing user data recorded in the optical disk 16.

In step S21, the recording and reproduction system 15 reproduces a reproduction signal corresponding to the RUB recorded in the optical disk 16 by irradiating the optical disk 16 with laser light and supplies the reproduction signal to the signal processing unit 17, and the processing proceeds to step S22.

In step S22, the signal processing unit 17 performs signal processing of the reproduction signal from the recording and reproduction system 15.

In the signal processing of the reproduction signal, the signal processing unit 17 performs processing of equalizing the reproduction signal, restoring the frame of the multilevel code as a channel code, and the like.

The signal processing unit 17 supplies the frame of the channel code obtained through the signal processing of the reproduction signal to the DCC deleting unit 18, and the processing proceeds from step S22 to step S23.

In step S23, the DCC deleting unit 18 deletes the DCC code from the frame of the channel code from the signal processing unit 17 and supplies the frame after the DCC code is deleted to the channel decoding unit 19, and the processing proceeds to step S24.

In step S24, the channel decoding unit 19 performs channel decoding of the frame of the channel code from the DCC deleting unit 18. The channel decoding unit 19 then supplies the frame after the channel decoding to the frame disassembling unit 20, and the processing proceeds from step S24 to step S25.

In step S25, the frame disassembling unit 20 disassembles the frame from the channel decoding unit 19 and supplies the row data obtained as a result to the ECC processing unit 21, and the processing proceeds to step S26.

In step S26, the ECC processing unit 21 collects the row data from the frame disassembling unit 20 to constitute an ECC block. Further, the ECC processing unit 21 corrects an error of the ECC block by performing ECC processing on the ECC block using the parity included in the ECC block and outputs the user data included in the ECC target data of the ECC block.

The user data is reproduced in units of RUB from the optical disk 16 by similar processing being performed hereinafter.

<Configuration Example of Channel Encoding Unit 13>

Figure 4:
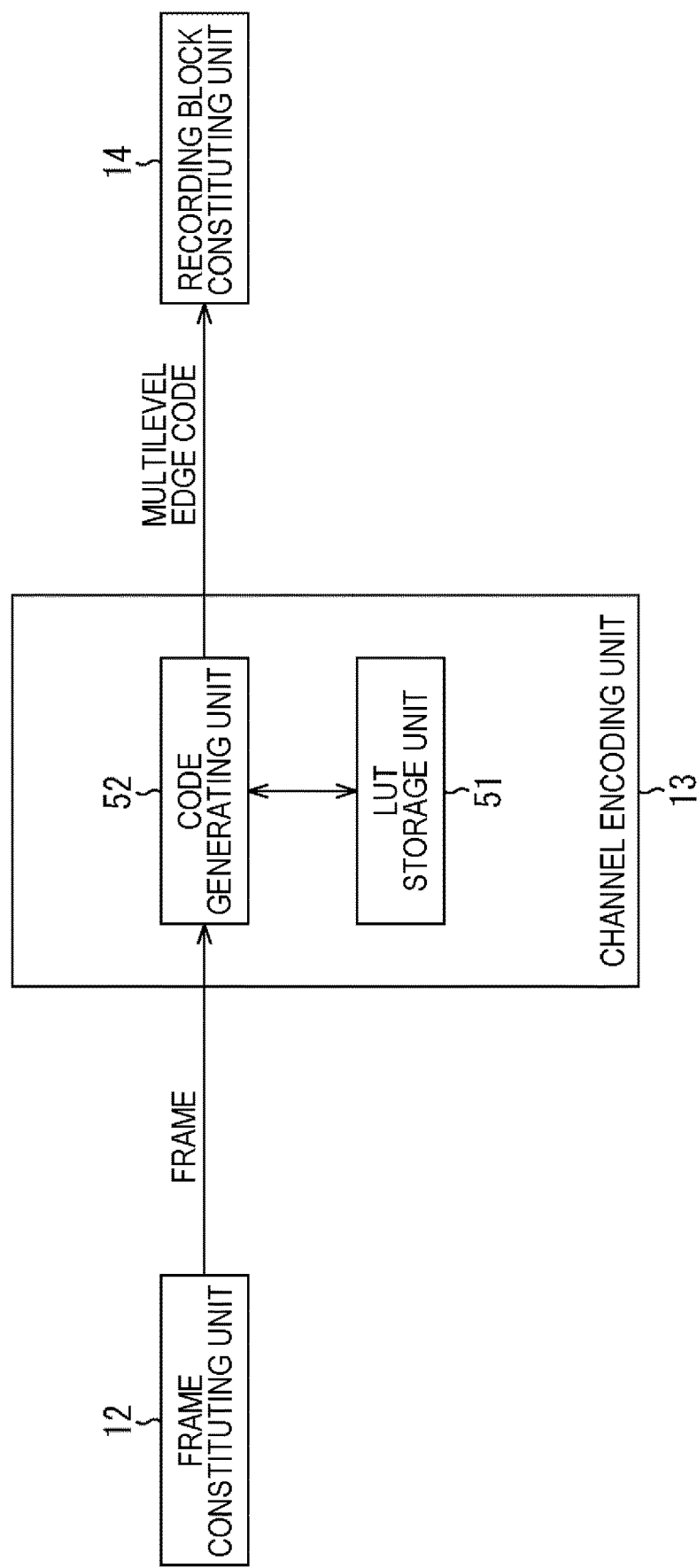
FIG. 4 is a block diagram illustrating a configuration example of a channel encoding unit 13.

FIG. 4 is a block diagram illustrating a configuration example of a channel encoding unit 13 in FIG. 1.

In FIG. 4, the channel encoding unit 13 includes a look up table (LUT) storage unit 51 and a code generating unit 52.

In the LUT storage unit 51, a code LUT in which a block code constituted with a sequence of multilevel edge codes generated using a code generation model which will be described later and binary data to be encoded into the multilevel edge codes are registered in association with each other is stored.

The frame including the user data is supplied to the code generating unit 52 from the frame constituting unit 12. The code generating unit 52 encodes the frame from the frame constituting unit 12 into a block code constituted with a sequence of the multilevel edge codes associated with the binary data in units of the binary data of a predetermined bit length with reference to the code LUT stored in the LUT storage unit 51. The code generating unit 52 then supplies the encoded frame to the RUB constituting unit 14.

In other words, the code generating unit 52 converts the frame into a block code constituted with a sequence of the multilevel edge codes associated with the binary data indicated with the predetermined bit length in the code LUT in units of the predetermined bit length.

<Configuration Example of Signal Processing Unit 17>

Figure 5:
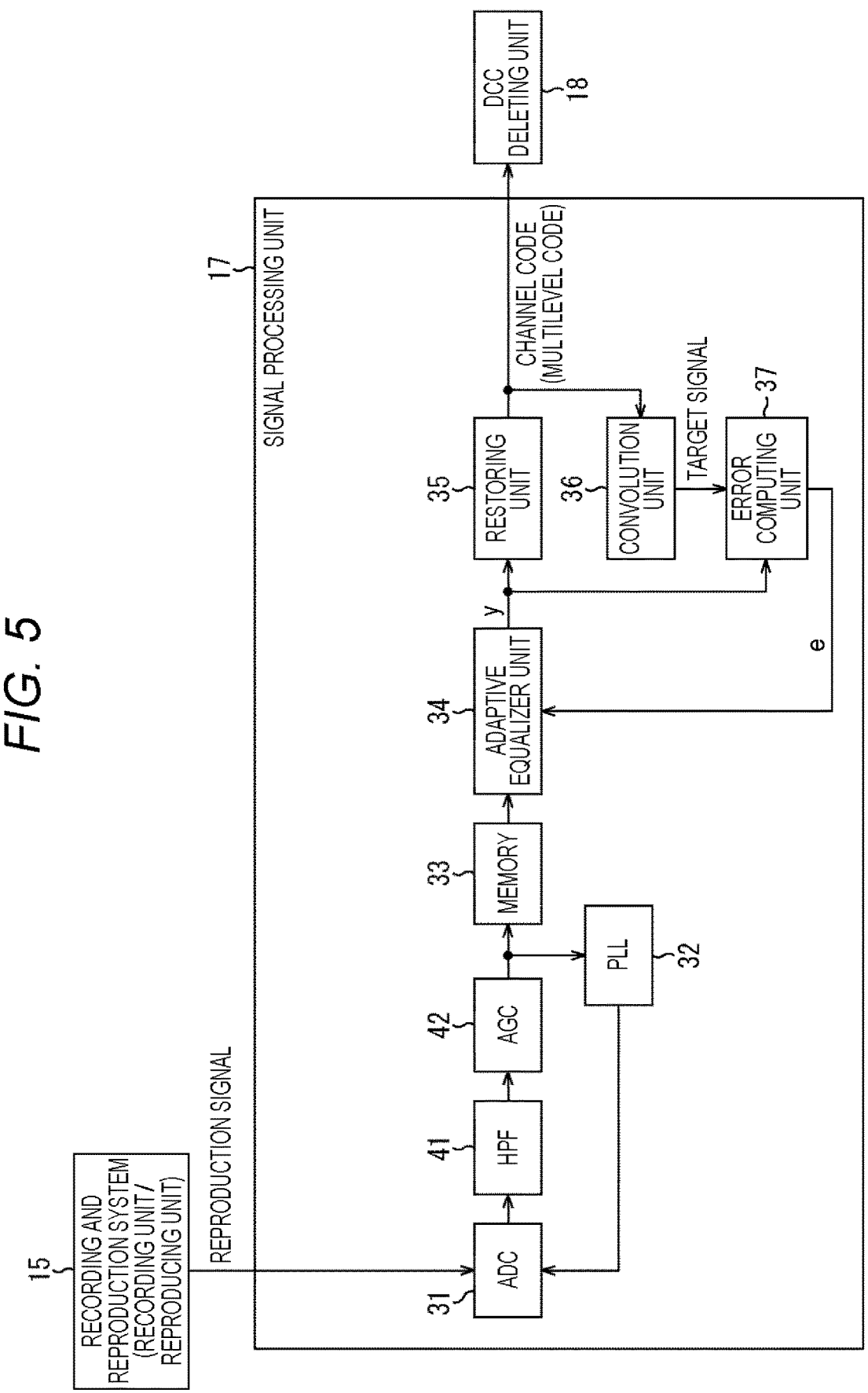
FIG. 5 is a block diagram illustrating a configuration example of a signal processing unit 17.

FIG. 5 is a block diagram illustrating a configuration example of a signal processing unit 17 in FIG. 1.

In FIG. 5, the signal processing unit 17 includes an analog to digital converter (ADC) 31, a phase locked loop (PLL) 32, a memory 33, an adaptive equalizer unit 34, a restoring unit 35, a convolution unit 36, an error computing unit 37, a high pass filter (HPF) 41, and an auto gain controller (AGC) 42.

The reproduction signal is supplied to the ADC 31 from the recording and reproduction system 15. The ADC 31 performs AD conversion of an analog reproduction signal from the recording and reproduction system 15 in synchronization with a channel clock supplied from the PLL 32 and outputs a digital reproduction signal obtained as a result of the AD conversion. The reproduction signal output from the ADC 31 is supplied to the PLL 32 and the memory 33 via the HPF 41 and the AGC 42.

The PLL 32 generates a clock in synchronization with the reproduction signal supplied from the ADC 31 via the HPF 41 and the AGC 42 as a channel clock and supplies the clock to the ADC 31 and other necessary blocks which constitute the recording and reproduction apparatus.

The memory 33 temporarily stores the reproduction signal supplied from the ADC 31 via the HPF 41 and the AGC 42.

The adaptive equalizer unit 34 adaptively equalizes the reproduction signal stored in the memory 33 and supplies an equalization signal y obtained by equalizing the reproduction signal like a PR signal obtained from a desired partial response (PR) channel to the restoring unit 35 and the error computing unit 37.

Here, an error e of the equalization signal y is supplied to the adaptive equalizer unit 34 from the error computing unit 37. The adaptive equalizer unit 34 adaptively equalizes the reproduction signal so as to make the error e from the error computing unit 37 smaller.

The restoring unit 35 restores (the frame of) the multilevel code which is a channel code, from the equalization signal y by performing maximum-likelihood decoding such as Viterbi decoding on the equalization signal y from the adaptive equalizer unit 34 and supplies the restoration result to the DCC deleting unit 18 and the convolution unit 36.

Note that the restoring unit 35 can restore the multilevel code using a method other than maximum-likelihood decoding, that is, for example, threshold processing, or the like.

The convolution unit 36 generates a target signal which is set as a target of the equalization signal y which is an equalization result of the adaptive equalizer unit 34 by convolving the restoration result from the restoring unit 35 and an impulse response of a desired PR channel and supplies the target signal to the error computing unit 37.

The error computing unit 37 obtains the error e of the equalization signal y from the adaptive equalizer unit 34 with respect to the target signal from the convolution unit 36 and supplies the error e to the adaptive equalizer unit 34.

Here, for example, Run_in included in the RUB recorded in the optical disk 16 has a known pattern. A target signal of the equalization signal y obtained by equalizing the reproduction signal having such a known pattern can be obtained through convolution between the known pattern and an impulse response of a desired PR channel as well as being obtained through convolution between the restoration result restored from the equalization signal y and an impulse response of a desired PR channel.

The HPF 41 cuts a direct current (DC) component of the reproduction signal by filtering the reproduction signal output by the ADC 31 and supplies the obtained reproduction signal to the AGC 42.

The AGC 42 performs auto gain control (AGC) processing of adjusting a gain of the reproduction signal from the HPF 41 and supplies the result to the PLL 32 and the memory 33.

<Expression Method for Expressing Multilevel Codes>

Figure 6:
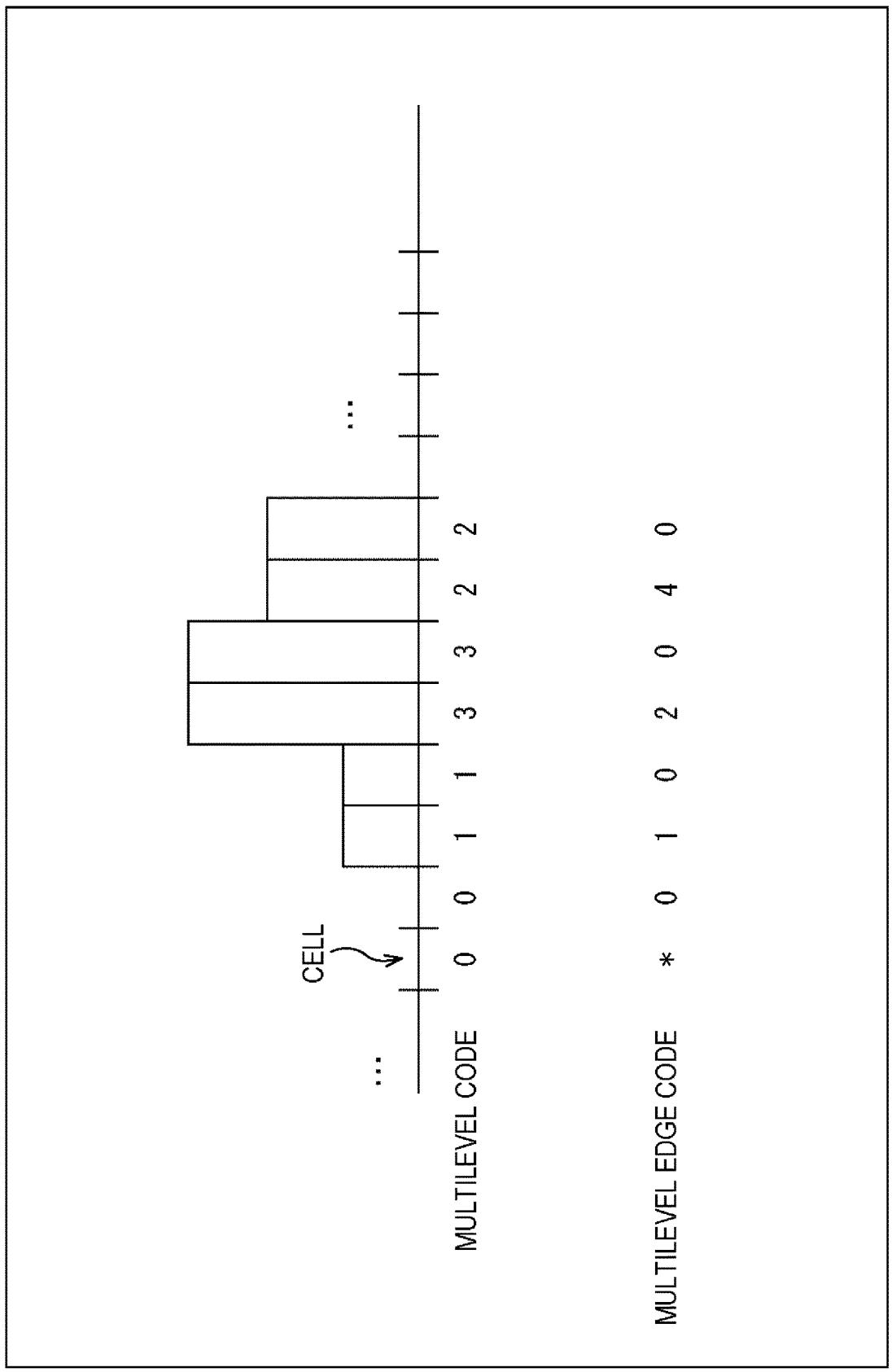
FIG. 6 is a diagram for explaining an expression method for expressing multilevel codes.

FIG. 6 is a diagram for explaining an expression method for expressing multilevel codes.

Here, it is assumed that one (value) of the multilevel codes of an ML value which is equal to or greater than 3 is set as a cell. n cells indicate arrangement of n multilevel codes. A code length of the multilevel codes can be expressed with cells.

The multilevel code of the ML value can be expressed with a multilevel edge code of the ML value.

The multilevel edge code is a code which expresses a value (level) of the multilevel code with an edge. The edge represents a change amount from an immediately preceding value of the multilevel code and is counted so that the multilevel code of the ML value assumes a value from 0 to ML−1 in turns.

For example, in a case where two consecutive cells of the multilevel codes for which ML=5 are 00, the change amount from the first cell of 0 to the second cell of 0 is 0, and thus, an edge between the two cells is 0.

For example, in a case where two consecutive cells of the multilevel codes for which ML=5 are 01, the change amount from the first cell of 0 to the second cell of 1 is 1, and thus, an edge between the two cells is 1.

For example, in a case where two consecutive cells of the multilevel codes for which ML=5 are 13, the change amount from the first cell of 1 to the second cell of 3 is 2, and thus, an edge between the two cells is 2.

For example, in a case where two consecutive cells of the multilevel codes for which ML=5 is 32, the change amount from the first cell of 3 to the second cell of 2 is 4 in a case where the change amount is counted so that the multilevel code assumes a value from 0 to 4=ML−1 in turns, and thus, an edge between the two cells is 4.

Thus, for example, the multilevel edge codes expressing the multilevel codes 00113322 . . . for which ML=5 become *0102040. * is a value determined by an immediately preceding value of 0 at the head of the multilevel codes 00113322 . . . .

In a case where (the value (level) of) the (t-th) multilevel code at time t is expressed as l(t), and the multilevel edge code at time t is expressed as c(t), the multilevel edge code c(t) satisfies an expression of l(t)=(l(t−1)+c(t)) % ML. % represents a modulus operator, and A % B represents a remainder in a case where A is divided by B.

The channel encoding unit 13 (FIG. 1) encodes the frame (including the user data) from the frame constituting unit 12 into the multilevel edge codes expressing the multilevel codes as described above.

The recording and reproduction system 15 then records the multilevel codes having values changing in accordance with the multilevel edge codes as the RUB from the RUB constituting unit 14, that is, the multilevel code l(t) obtained in accordance with the expression of l(t)=(l(t−1)+c(t)) % ML in the optical disk 16. Further, the recording and reproduction system 15 reproduces the multilevel codes (multilevel codes having values changing in accordance with the multilevel edge codes) recorded in this manner from the optical disk 16.

<Code Generation Model>

Figure 7:
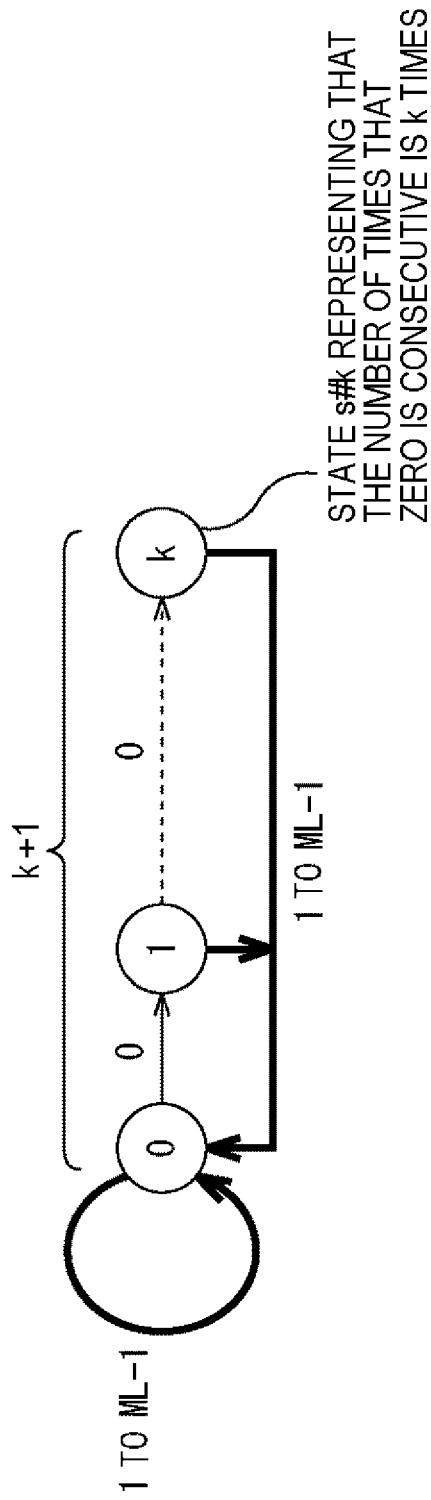
FIG. 7 is a diagram illustrating a code generation model for generating (multilevel codes expressed with) multilevel edge codes.

FIG. 7 is a diagram illustrating a code generation model for generating (the multilevel codes expressed with) the multilevel edge codes to be registered in the code LUT of the LUT storage unit 51 (FIG. 4).

The code generation model has a state representing the number of times that zero is consecutive corresponding to the number of ways that an edge is consecutively 0. Thus, in a case where the maximum number of consecutive times which is a maximum value of the number of times that zero is consecutive is expressed as k, the code generation model has a total of k+1 states including a state s0 representing that the number of times that zero is consecutive is 0, states s1 representing that the number of times that zero is consecutive is 1, . . . , and a state s #k representing that the number of times that zero is consecutive is k.

In the code generation model, the state transitions to a state s #k' representing that the number of times that zero is consecutive where an edge is consecutively zero is k' (<=k), including 0 in a case where 0 is output as the multilevel edge code, and the state transitions to the state s0 representing that the number of times that zero is consecutive is 0 in a case where one of 1 to ML−1 is output as the multilevel edge code. In the state s #k representing that the number of times that zero is consecutive is the maximum number of consecutive times k, only one of 1 to ML−1 other than 0 can be output as the multilevel edge code, and the state transitions to the state s0 after one of 1 to ML−1 is output as the multilevel edge code.

The multilevel edge code to be registered in the code LUT is generated through state transition of the code generation model as described above.

Typically, concerning a channel code (recording modulation code), to secure frequency of obtaining information for detection, or the like, of a phase error at the PLL, or the like, which generates a channel clock, that is, to secure frequency of transition (change) of the value of the channel code, the maximum value of the number of times that the same value is consecutive is limited, that is, so-called k limitation is performed.

Figure 8:
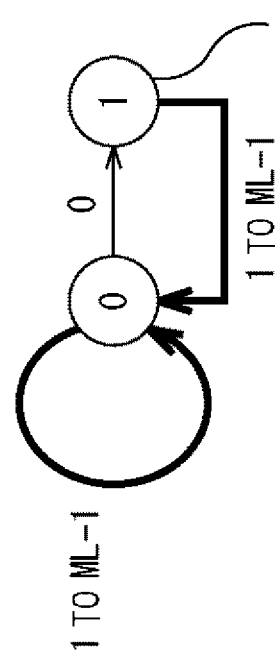
FIG. 8 is a diagram illustrating a code generation model in a case where a maximum number of consecutive times k is limited to 1.

FIG. 8 is a diagram illustrating a code generation model in a case where a maximum number of consecutive times k is limited to 1.

In a case where the maximum number of consecutive times k=1, the code generation model is constituted with the state s0 representing that the number of times that zero is consecutive is 0, and the state s1 representing that the number of times that zero is consecutive is 1.

In a case of the state s0, one of 0 to ML−1 can be output as the multilevel edge code. In the state s0, in a case where 0 is output as the multilevel edge code, the state transitions from the state s0 to the state s1, and, in a case where one of 1 to ML−1 is output, the state transitions from the state s0 to the state s0.

In a case of the state s1, 0 cannot be output as the multilevel edge code, and one of 1 to ML−1 other than 0 can be output. In the state s1, one of 1 to ML−1 is output as the multilevel edge code, and the state transitions from the state s1 to the state s0.

Generation of (the multilevel codes expressed with) the multilevel edge codes using the code generation model will be described below using an example of the multilevel edge codes for which the number of values ML which the multilevel code can assume is 5.

<Multilevel Edge Codes for which ML=5>

Figure 9:
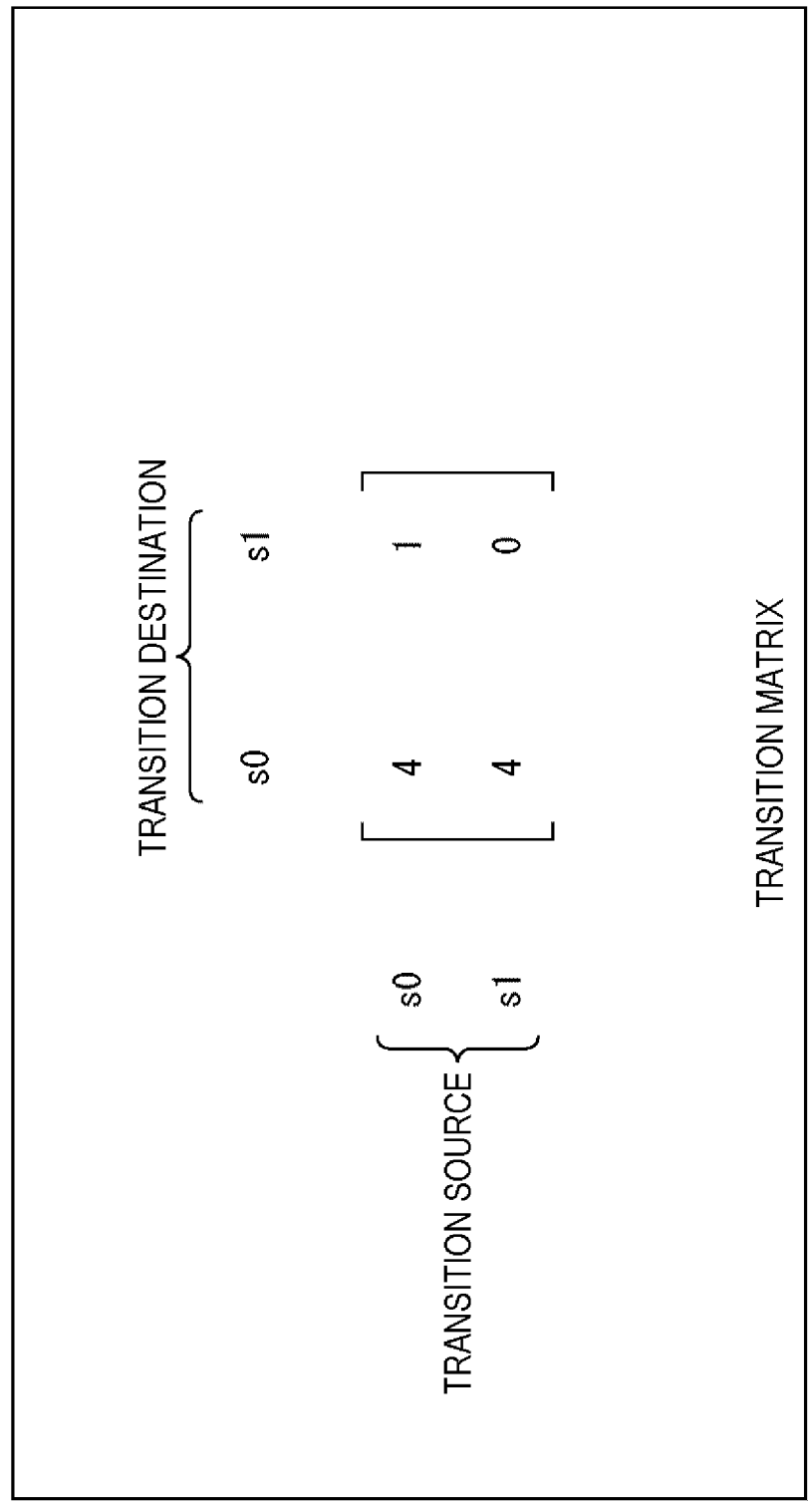
FIG. 9 is a diagram illustrating a transition matrix representing state transition of the code generation model for generating multilevel edge codes for which ML=5 and the maximum number of consecutive times k=1.

FIG. 9 is a diagram illustrating a transition matrix representing state transition of the code generation model for generating multilevel edge codes for which ML=5 and the maximum number of consecutive times k=1.

In the transition matrix in FIG. 9, each row represents a state of a transition source of the state transition, and each column represents a state of a transition destination of the state transition. An element in row i and column j represents the number of ways of state transition from a state s #i to a state s #j existing in the code generation model.

In the code generation model (hereinafter, also described as a code generation model for which k=1 and ML=5) which generates the multilevel edge code for which the maximum number of consecutive times k=1 and ML=5, four ways of state transition which output the multilevel edge codes 1, 2, 3, and 4 exist as state transition from the state s0 to the state s0. One way of state transition which outputs the multilevel edge code 0 exists as state transition from the state s0 to the state s1, and four ways of state transition which output the multilevel edge codes 1 to 4 exist as state transition from the state s1 to the state s0. There is no state transition from the state s1 to the state s1.

Theoretical limitation of the code rate of (the multilevel codes expressed with) the multilevel edge codes generated using (state transition of) the code generation model for which k=1 and ML=5 can be obtained as Shannon capacity. The Shannon capacity can be obtained with eigenvalues of the transition matrix which represents state transition of the code generation model.

The transition matrix in FIG. 9 is a matrix having two rows and two columns, and thus, (up to) two eigenvalues can be obtained. While the eigenvalue may assume a complex number, a maximum value among values which assume positive values among the eigenvalues in the transition matrix becomes theoretical limitation of the code rate called Shannon capacity.

Two eigenvalues EV[0] and EV[1] of the transition matrix in FIG. 9 are EV[0]≈4.828427+j0 and EV[1]≈−0.82843+j0 in a case where j is set as an imaginary unit. Thus, Shannon capacity of (the multilevel codes expressed with) the multilevel edge codes generated using the code generation model for which k=1 and ML=5 becomes (approximately) 4.828427 which is a maximum value among values which assume positive real number of the two eigenvalues EV[0] and EV[1].

The Shannon capacity represents the number of symbols which can be expressed per one cell with the multilevel code (expressed with the multilevel edge code) generated using the code generation model, and becomes a value less than ML by limitation of the maximum number of consecutive times k. The Shannon capacity of 4.828427 means that 4.828427 (symbols) can be expressed per one cell of the multilevel code.

In encoding into the multilevel codes (conversion into the multilevel codes), for example, binary data having a certain bit length is converted into (a sequence of) the multilevel codes which are arrangement of cells having values equal to or greater than 1. The code rate therefore should be expressed in units of bit/cell.

The code rate of theoretical limitation (theoretical limitation code rate) of the multilevel code, that is, a maximum bit length of binary data which can be theoretically allocated to one cell of the multilevel code can be obtained as (approximately) 2.271553=$\log_2$ 4.828427 bits by calculating $\log_2$ of the Shannon capacity of 4.828427.

Figure 10:
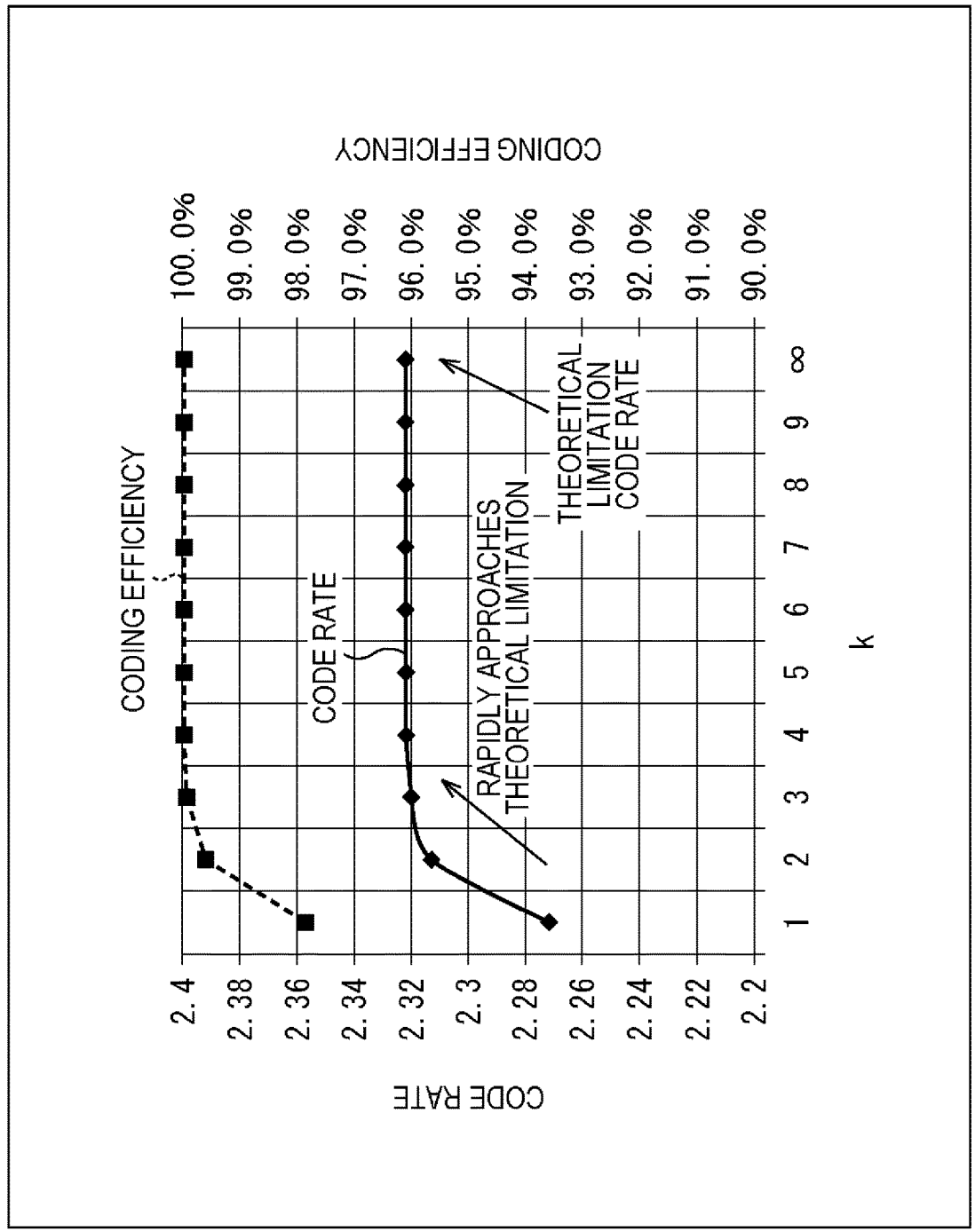
FIG. 10 is a diagram illustrating relationship among the maximum number of consecutive times k for the multilevel codes for which ML=5, a code rate, and coding efficiency.

FIG. 10 is a diagram illustrating relationship among the maximum number of consecutive times k for the multilevel codes for which ML=5, a code rate, and coding efficiency.

Here, while the theoretical limitation code rate of the multilevel codes for which ML=5 in a case where the maximum number of consecutive times k=∞ is (approximately) 2.32≈$\log_2$ 5, the code rate in FIG. 10 represents a ratio of the code rate with respect to this theoretical limitation code rate 2.32 in a case where the maximum number of consecutive times k=∞.

According to FIG. 10, in a case where the maximum number of consecutive times k of the multilevel codes for which ML=5 becomes equal to or greater than 2, it can be confirmed that the code rate rapidly approaches the theoretical limitation code rate, and the coding efficiency becomes equal to or higher than 99%.

It is now assumed that, for example, a scheme of converting binary data having m bits into (a sequence of multilevel edge codes expressing) a block code having a fixed length (n cells) constituted with a sequence of multilevel codes of n cells is employed as an encoding scheme for multilevel encoding at the channel encoding unit 13 so as to be able to be implemented as a circuit. A block code constituted with the multilevel codes (expressed with the multilevel edge codes) for which ML=5 among block codes having a fixed length constituted with a sequence of multilevel codes of n cells will be described below.

<Block Code>

FIG. 11 is a diagram illustrating specifications of a block code constituted with multilevel codes for which ML=5 in a case where the maximum number of consecutive times k=4.

In FIG. 11, a code length n indicates a code length of the block code having a fixed length, that is, the number of cells of (a sequence of) the multilevel codes constituting the block code. The number of symbols Ns is the number of symbols which can be expressed with the multilevel codes of n cells for which ML=5 as the block code, that is, the number of code words of the block code constituted with the multilevel codes in n cells for which ML=5, and becomes a value equal to or less than the n-th power of 5 because of limitation of the maximum number of consecutive times k=4. The bit length B of binary data represents the bit length of binary data of one block code, that is, the bit length of binary data which can be encoded into (allocated to) the multilevel codes of n cells for which ML=5, and is a maximum integer value equal to or less than $\log_2(Ns)$. The code rate R represents a value obtained by dividing the bit length B of binary data by the code length n. The coding efficiency Ef represents a ratio of the code rate R with respect to the theoretical limitation code rate (approximately 2.32) of the multilevel codes (generated by the code generation model) for which k=4 and ML=5.

Generation of, for example, a block code whose code length n is four cells and which has high coding efficiency of 97% among block codes constituted with (the multilevel edge codes expressing) the multilevel codes for which k=4 and ML=5 illustrated in FIG. 11 will be described below.

Note that binary data having a bit length B=9 bits is encoded into a block code constituted with the multilevel codes of four cells in a block code whose code length n is four cells and which is constituted with the multilevel codes for which k=4 and ML=5, and such a block code will be also referred to as a 9 bit/4 cell code for which k=4 and ML=5.

Figure 12:
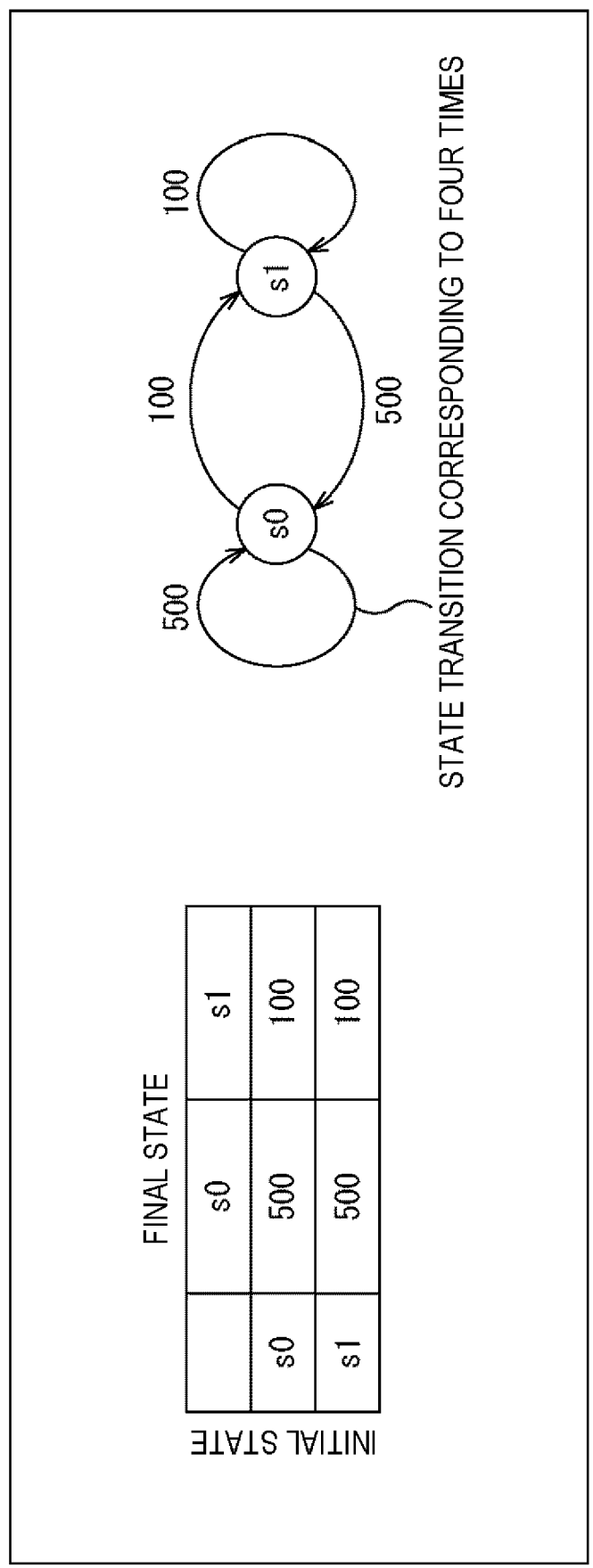
FIG. 12 is a diagram for explaining 9 bit/4 cell codes for which k=4 and ML=5.

FIG. 12 is a diagram for explaining 9 bit/4 cell codes for which k=4 and ML=5.

(A sequence of) the multilevel edge codes (expressing the multilevel codes) constituting the 9 bit/4 cell code for which k=4 and ML=5 can be generated through four times of state transition starting from a certain state as an initial state in the code generation model for which k=4 and ML=5. Now, a state reached after four times of state transition will be referred to as a final state.

FIG. 12 illustrates the number of block codes (hereinafter, also referred to as s0→s0 codes) constituted with a sequence of the multilevel edge codes generated through four times of state transition from the state s0 as the initial state to the state s0 as the final state, block codes (hereinafter, also referred to as s0→s1 codes) constituted with a sequence of the multilevel edge codes generated through four times of state transition from the state s0 as the initial state to the state s1 as the final state, block codes (hereinafter, also referred to as s1→s0 codes) constituted with a sequence of the multilevel edge codes generated through four times of state transition from the state s1 as the initial state to the state s0 as the final state, and block codes (hereinafter, also referred to as s1→s1 codes) constituted with a sequence of the multilevel edge codes generated through four times of state transition from the state s1 as the initial state to the state s1 as the final state.

There exist 500 s0→s0 codes, and 100 s0→s1 codes. There exist 500 s1→s0 codes, and 100 s1→s1 codes.

FIG. 13 is a diagram illustrating 500 s0→s0 codes and 500 s1→s0 codes and part of state transition in a case where the s0→s0 codes and the s1→s0 codes are generated.

A of FIG. 13 illustrates 500 s0→s0 codes and part of state transition in a case where the 500 s0→s0 codes are generated. B of FIG. 13 illustrates 500 s1→s0 codes and part of state transition in a case where the 500 s1→s0 codes are generated.

The present inventor has confirmed that the same code can be obtained for the 500 s0→s0 codes and the 500 s1→s0 codes while ways of the state transition are not the same.

In other words, the 500 s0→s0 codes as a first set of block codes constituted with a sequence of the multilevel edge codes generated through four times of state transition from the state s0 (first state) as the initial state to the state s0 (second state) as the final state match the 500 s1→s0 codes as a second set of block codes constituted with a sequence of the multilevel edge codes generated through four times of state transition from the state s1 (third state) as the initial state to the state s0 (fourth state) as the final state.

FIG. 14 is a diagram illustrating 100 s0→s1 codes and 100 s1→s1 codes and part of state transition in a case where the s0→s1 codes and the s1→s1 codes are generated.

A of FIG. 14 illustrates 100 s0→s1 codes and part of state transition in a case where the 100 s0→s1 codes are generated. B of FIG. 14 illustrates 100 s1→s1 codes and part of state transition in a case where the 100 s1→s1 codes are generated.

The present inventor has confirmed that the same code can be obtained for the 100 s0→s1 codes and the 100 s1→s1 codes while ways of the state transition are not the same.

In other words, the 100 s0→s1 codes as a first set of block codes constituted with a sequence of the multilevel edge codes generated through four times of state transition from the state s0 (first state) as the initial state to the state s1 (second state) as the final state match the 100 s1→s1 codes as a second set of block codes constituted with a sequence of the multilevel edge codes generated through four times of state transition from the state s1 (third state) as the initial state to the state s1 (fourth state) as the final state.

A total of 600 block codes including 500 s0→s0 codes and 100 s0→s1 codes generated through four times of state transition from the state s0 as the initial state matches a total of 600 block codes including 500 s1→s0 codes and 100 s1→s1 codes generated through four times of state transition from the state s1 as the initial state.

Thus, in a case where block codes to be used for channel encoding are employed from the above-described 600 block codes generated through four times of state transition from the state s0 or the state s1 as the initial state, it is not necessary to monitor a final state in a case where binary data of immediately preceding nine bits is encoded or an initial state in a case where binary data immediately following nine bits is encoded in encoding of new binary data of 9 bits. In other words, binary data can be encoded while the final state in a case where the immediately preceding binary data is encoded and the initial state in a case where the immediately following binary data is encoded are regarded as the state s0 or s1.

Concerning a 9 bit/4 cell code for which k=4 and ML=5, 600 block codes generated through four times of state transition from the state s0 as the initial state (or 600 block codes generated through four times of state transition from the state s1 as the initial state) are set as candidate codes which become candidates for codes to be employed in encoding.

Then, 512-29 codes which are to be employed to encode binary data of nine bits (which are to be allocated to binary data of nine bits) are selected from the 600 candidate codes.

<RMTR (Repeated Minimum Transition Run)>

Figure 15:
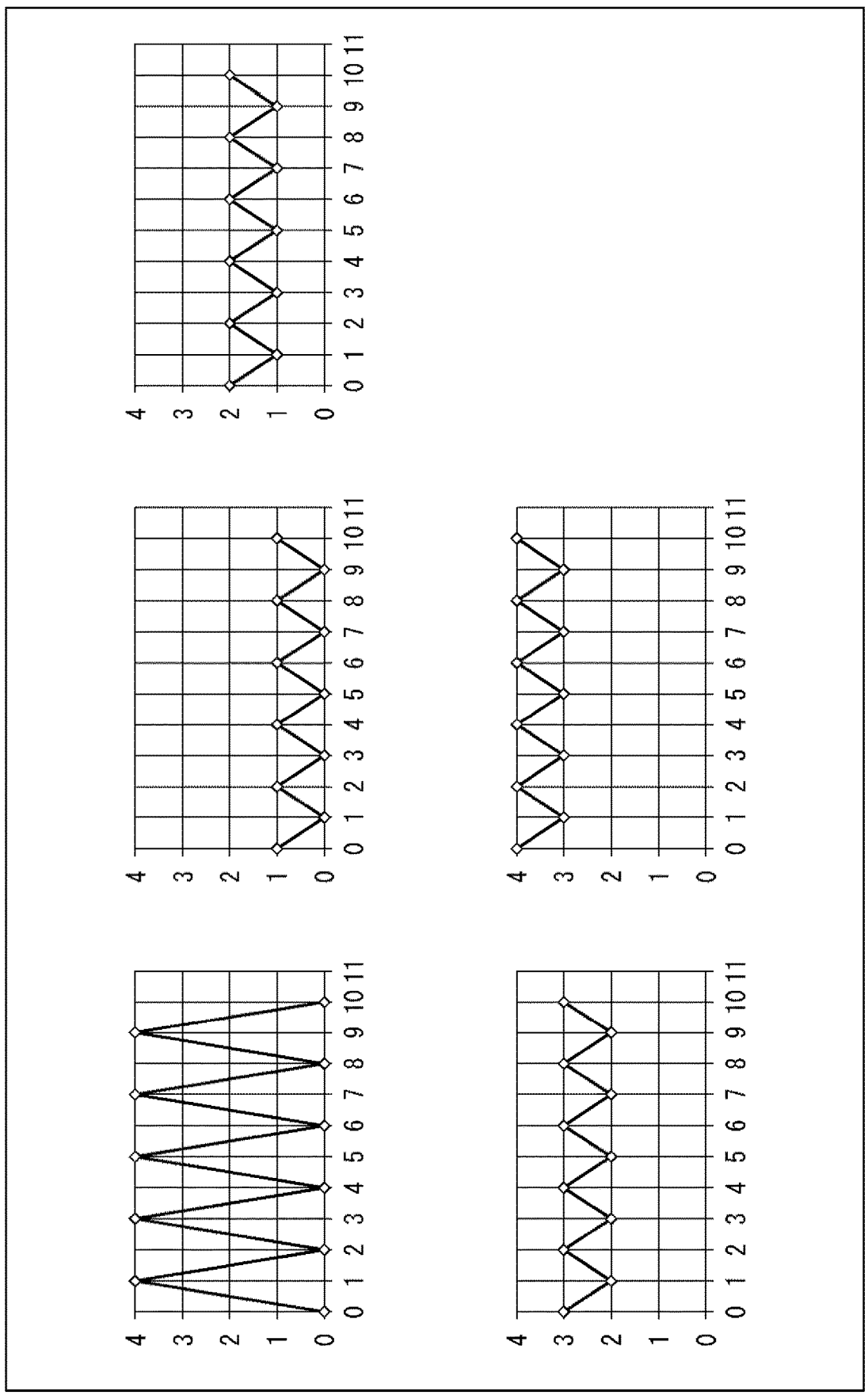
FIG. 15 is a diagram illustrating a minimum transition pattern occurring in a sequence of multilevel codes for which ML=5.
Figure 16:
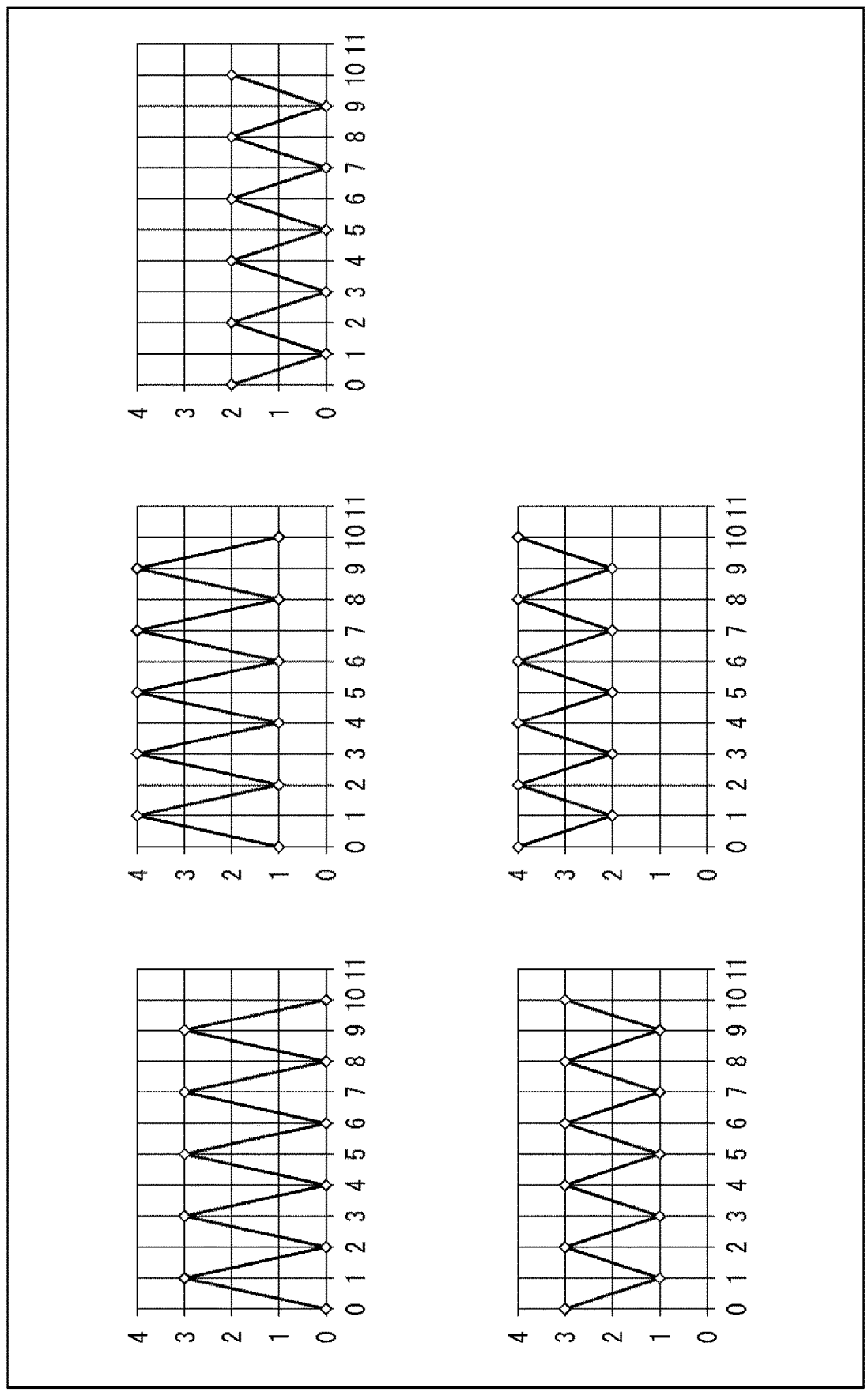
FIG. 16 is a diagram illustrating a minimum transition pattern occurring in a sequence of multilevel codes for which ML=5.

FIGS. 15 and 16 are diagrams illustrating a minimum transition pattern occurring in a sequence of multilevel codes for which ML=5.

FIG. 15 illustrates a minimum transition pattern occurring in the multilevel codes in a case where 41 is repeated in (the block code constituted with) the multilevel edge codes for which ML=5, and FIG. 16 illustrates a minimum transition pattern occurring in the multilevel codes in a case where 23 is repeated in the multilevel edge codes for which ML=5.

The minimum transition pattern means a pattern in which change of the same value (level) is repeated in a minimum period.

In optical recording, repeated minimum transition run (RMTR) is limited due to a low reproduction gain in a high frequency. For example, RMTR is limited to 6 and 2 respectively in a 17PP code and a 110PCWA code as a binary channel code (binary code).

Limitation of the RMTR prevents the minimum transition pattern from frequently occurring, which results in being able to reduce a high-frequency component of a reproduction signal.

A method for limiting the RMTR for the multilevel codes of the ML value will be described.

In (a sequence of) the multilevel codes of the ML value, in a case where the multilevel edge code $c(t)$ satisfies an expression of $(c(t)+c(t+1))\% ML=0$, a minimum transition pattern occurs.

Here, the expression of $(c(t)+c(t+1))\% ML=0$ will be also referred to as a modulo edge condition.

For example, in a case where the multilevel edge code $c(t)$ is 4, and the multilevel edge code $c(t+1)$ is 1, the modulo edge condition is satisfied. The number of times that the modulo edge condition is consecutively satisfied, that is, a duration during which the minimum transition pattern continues is set as a continuous length of a modulo edge. For example, among the multilevel edge codes (expressing the multilevel codes) of four cells which constitute a 9 bit/4 cell code, in a case where while the first and the second multilevel edge codes and the second and the third multilevel edge codes satisfy the modulo edge condition, the third and the fourth multilevel edge codes do not satisfy the modulo edge condition, the continuous length of the modulo edge is 2.

As described in FIG. 6, the multilevel code $l(t)$ obtained in accordance with the expression of $l(t)=(l(t-1)+c(t))\% ML$ is recorded in the optical disk 16.

Thus, in a case where 41 which satisfies the modulo edge condition continues as the multilevel edge codes in the multilevel codes for which ML=5, the minimum transition pattern continues in the multilevel codes.

In other words, for example, in a case where the (immediately preceding) multilevel code $l(t-1)$ is 0, in a case where 41 which satisfies the modulo edge condition continues as the multilevel edge codes, the multilevel code $l(t)$ at time t becomes $(l(t-1)+c(t))\% ML=(0+4)\% 5=4$. Further, the multilevel code $l(t+1)$ at time t+1 becomes $(l(t)+c(t+1))\% ML=(4+1)\% 5=0$. Still further, the multilevel code $l(t+2)$ at time t+2 becomes $(l(t+1)+c(t+2))\% ML=(0+4)\% 5=4$. In a similar manner, the subsequent multilevel codes appear in a minimum transition pattern in which 0 and 4 are repeated.

As described above, in a case where 41 which satisfies the modulo edge condition continues as the multilevel edge codes, in a case where the immediately preceding multilevel code is 0, the multilevel codes appear in a minimum transition pattern in which 0 and 4 are repeated as illustrated in FIG. 15.

In a case where the immediately preceding multilevel code is 1, the multilevel codes appear in a minimum transition pattern in which 1 and 0 are repeated as illustrated in FIG. 15, and in a case where the immediately preceding multilevel code is 2, the multilevel codes appear in a minimum transition pattern in which 2 and 1 are repeated as illustrated in FIG. 15. In a case where the immediately preceding multilevel code is 3, the multilevel codes appear in a minimum transition pattern in which 3 and 2 are repeated as illustrated in FIG. 15, and in a case where the immediately preceding multilevel code is 4, the multilevel codes appear in a minimum transition pattern in which 4 and 3 are repeated as illustrated in FIG. 15.

Further, in a case where 32 which satisfies the modulo edge condition continues as the multilevel edge codes, in a case where the immediately preceding multilevel code is 0, the multilevel codes appear in a minimum transition pattern in which 0 and 3 are repeated as illustrated in FIG. 16.

In a case where the immediately preceding multilevel code is 1, the multilevel codes appear in a minimum transition pattern in which 1 and 4 are repeated as illustrated in FIG. 16, and in a case where the immediately preceding multilevel code is 2, the multilevel codes appear in a minimum transition pattern in which 2 and 0 are repeated as illustrated in FIG. 16. In a case where the immediately preceding multilevel code is 3, the multilevel codes appear in a minimum transition pattern in which 3 and 1 are repeated as illustrated in FIG. 16, and in a case where the immediately preceding multilevel code is 4, the multilevel codes appear in a minimum transition pattern in which 4 and 2 are repeated as illustrated in FIG. 16.

Also in a case where 14 or 23 which satisfies the modulo edge condition continues as the multilevel edge codes, the multilevel codes appear in a minimum transition pattern in a similar manner.

It is possible to prevent the multilevel codes from appearing in a minimum transition pattern by limiting a continuous length of the modulo edge during which the modulo edge condition is continuously satisfied.

FIG. 17 is a diagram illustrating a start continuous length and a termination continuous length of 500 s0→s0 codes (or s1→s0 codes) and 100 s0→s1 codes (or 100 s1→s1 codes) which are 600 candidate codes for the 9 bit/4 cell code for which k=4 and ML=5.

The start continuous length is a continuous length of a modulo edge at the head portion of the block code, that is, the number of times the modulo edge condition is continuously satisfied from a head cell toward a tail cell. The termination continuous length means a continuous length of the modulo edge at a termination portion of the block code, that is, the number of times the modulo edge condition is continuously satisfied from the tail cell toward the head cell.

In FIG. 17, each row represents the start continuous length, and each column represents the termination continuous length. A value in a field of the start continuous length of i and the termination continuous length of j indicates the number of candidate codes whose start continuous length is i and termination continuous length is j.

A of FIG. 17 illustrates a start continuous length and a termination continuous length for 500 s0→s0 codes among 600 candidate codes for the 9 bit/4 cell code for which k=4 and ML=5. B of FIG. 17 illustrates a start continuous length and a termination continuous length for 100 s0→s1 codes among 600 candidate codes for the 9 bit/4 cell code for which k=4 and ML=5.

According to FIG. 17, 500 s0→s0 codes include 336 block codes for which the start continuous length i is 0 and the termination continuous length j is limited to 0 (hereinafter, described as (i, j) codes), 68 (0, 1) codes, 16 (0, 2) codes, 4 (0, 3) codes, 52 (1, 0) codes, 12 (1, 1) codes, and 12 (2, 0) codes. Further, 100 s0→s1 codes include 84 (0, 0) codes, 12 (1, 0) codes, and 4 (2, 0) codes.

Note that 600 candidate codes for the 9 bit/4 cell code for which k=4 and ML=5 do not include candidate codes whose middle portion except the head portion and the tail portion, that is, the second cell and the third cell satisfy the modulo edge condition. It can be therefore said that 600 candidate codes for the 9 bit/4 cell code for which k=4 and ML=5 are block codes whose continuous length of a modulo edge in the middle portion (hereinafter, also referred to as a middle continuous length) is limited to 0.

The RMTR of the multilevel codes (multilevel edge codes) of the ML value is expressed with a duration of the minimum transition pattern.

There is a case where the minimum transition pattern appears between a multilevel edge code at the tail of a certain block code and a multilevel edge code at the head of the next block code as a result of the modulo edge condition being satisfied as well as a case where the minimum transition pattern appears in one block code.

For example, as illustrated in FIG. 17, 600 candidate codes for the 9 bit/4 cell code for which k=4 and ML=5 include 336 s0→s0 codes for which both the start continuous length and the termination continuous length are 0. For example, 1334 and 1111 are candidate codes (s0→s0 codes) for which both the start continuous length and the termination continuous length are 0. Concerning these candidate codes 1334 and 1111 for which both the start continuous length and the termination continuous length are 0, in a case where the candidate code 1111 follows the candidate code 1334, arrangement 41 of the multilevel edge code 4 (=c(t)) at the tail of the candidate code 1334 and the multilevel edge code 1 (=c(t+1)) at the head of the candidate code 1111 satisfies the modulo edge condition. Thus, in a case where only candidate codes for which both the start continuous length and the termination continuous length are 0 are employed, the RMTR becomes 1.

In conclusion of the above, it is not possible to limit the RMTR to a value smaller than the start continuous length+the termination continuous length+1 which is a value obtained by adding 1 to an addition value of the start continuous length and the termination continuous length. Here, the start continuous length+the termination continuous length+1 will be also referred to as a minimum length of the modulo edge.

To limit the RMTR to a smaller value, it is necessary to select a candidate code which has a smaller start continuous length and a smaller termination continuous length as a code to be employed as a first condition and exclude a candidate code whose middle continuous length is greater than a minimum length of the modulo edge from codes to be employed (candidate codes) as a second condition.

The middle continuous length of 600 candidate codes for the 9 bit/4 cell code for which k=4 and ML=5 is 0 as described above, and thus, the second condition is satisfied.

It is therefore possible to limit the RMTR to a smaller value by selecting a code to be employed in accordance with the first condition for 600 candidate codes for the 9 bit/4 cell code for which k=4 and ML=5.

Thus, in the present technology, 512 ($=2^9$) candidate codes necessary for encoding nine bits are selected from 600 candidate codes for the 9 bit/4 cell code for which k=4 and ML=5 in FIG. 17 as codes to be employed as described below.

First, (0, 0) codes for which both the start continuous length i and the termination continuous length j are limited to 0 corresponding to the number closer to 512 which are the number of codes to be employed and which are necessary for encoding nine bits (hereinafter, also referred to as the necessary number of codes) are selected as codes to be employed from 600 candidate codes in FIG. 17.

In other words, 336 (0, 0) codes for which the start continuous length i is 0 and the termination continuous length j is limited to 0 in 500 s0→s0 codes in A of FIG. 17 are selected as codes to be employed.

Further, 84 (0, 0) codes for which the start continuous length i is 0 and the termination continuous length j is limited to 0 in 100 s0→s1 codes in B of FIG. 17 are selected as codes to be employed.

Then, (1, 0) codes and (0, 1) codes for which one of the start continuous length i and the termination continuous length j is 1 and the other is limited to 0 corresponding to the number of 92 which is the rest of the necessary number of codes of 512 are selected as codes to be employed from 600 candidate codes in FIG. 17.

In other words, for example, in 500 s0→s0 codes in A of FIG. 17, 46 codes among 68 (0, 1) codes for which the start continuous length i is 0 and the termination continuous length j is limited to 1, and 46 codes among 52 (1, 0) codes for which the start continuous length i is 1 and the termination continuous length j is limited to 2 are selected as codes to be employed.

In the code LUT in the LUT storage unit 51 in FIG. 4, block codes selected as 512 codes to be employed for the 9 bit/4 cell code for which k=4 and ML=5 can be registered as described above. In this case, the RMTR of the block codes registered in the code LUT becomes 3=1+1+1 which is a minimum length of the modulo edge.

Here, it can be said from above that the block codes to be registered in the code LUT are block codes for which the start continuous length, the termination continuous length, and the middle continuous length are limited.

Further, it can be also said that the block codes to be registered in the code LUT are block codes for which the middle continuous length is limited to equal to or smaller than the minimum length of the modulo edge.

Note that in a case where the number of candidate codes which can be selected as codes to be employed is less than the necessary number of codes as a result of applying the second condition, that is, as a result of excluding candidate codes for which the middle continuous length is greater than the minimum length of the modulo edge from the codes to be employed, the codes to be employed are selected from candidate codes for which the middle continuous length is greater than the minimum length of the modulo edge. In this case, the RMTR becomes greater than the minimum length of the modulo edge and becomes a maximum value of the middle continuous length of the codes to be employed.

FIGS. 18, 19, 20, 21, 22, and 23 are diagrams illustrating an example of a code LUT in which 512 block codes are registered as 9 bit/4 cell codes for which k=4 and ML=5.

In the code LUT, (multilevel edge codes of four cells constituting) the block code selected as the code to be employed as described in FIG. 17 and binary data are registered in association with each other. According to the code LUT in FIG. 18 to FIG. 23, for example, binary data 0 (here, zero expressed with nine bits) is encoded into (multilevel edge codes of four cells constituting) a block code 1111.

Figure 24:
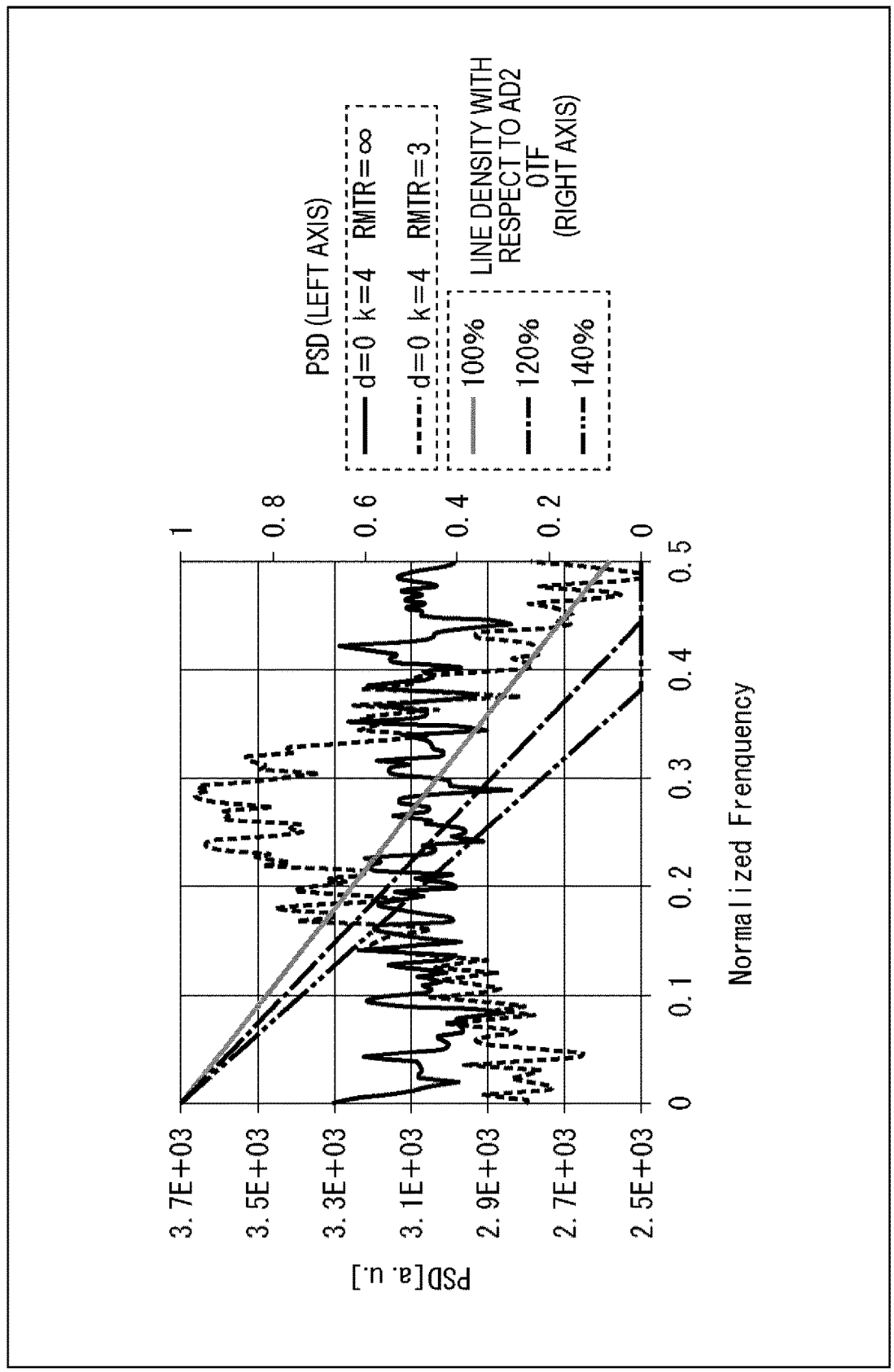
FIG. 24 is a diagram illustrating power spectral density (PSD) of 9 bit/4 cell codes for which k=4 and ML=5 selected in accordance with first and second conditions.

FIG. 24 is a diagram illustrating power spectral density (PSD) of 9 bit/4 cell codes for which k=4 and ML=5 selected in accordance with first and second conditions.

FIG. 24 indicates a normalized frequency normalized with a frequency of a channel clock on a horizontal axis and indicates PSD on a vertical axis.

Note that FIG. 24 illustrates PSD of a block code randomly generated from the code generation model for which k=4 and ML=5 (hereinafter, also referred to as a random block code) as well as PSD of the 9 bit/4 cell code for which k=4 and ML=5 selected in accordance with the first and the second conditions (portion indicated with a dotted line in FIG. 24).

Further, FIG. 24 also illustrates an optical transfer function (OTF) as characteristics of optical recording and reproduction in which line density is 100%, 120%, and 140% with respect to an archival disc (AD) 2 format.

The AD2 is an optical disk in which data can be recorded at high line density, and, for example, is described in "White Paper: Archival Disc Technology $2^{nd}$ Edition", July 2018.

The RMTR of the random block code is not limited (RMTR=∞). Further, a minimum value d of the number of times that zero is consecutive of both the 9 bit/4 cell code for which k=4 and ML=5 selected in accordance with the first and the second conditions, and the random block code, is 0.

According to the 9 bit/4 cell code for which k=4 and ML=5 selected in accordance with the first and the second conditions, it can be confirmed that a high frequency component of PSD near and after a frequency of ½ of the channel clock is suppressed compared to that in the random code by limitation of RMTR=3.

As illustrated in FIG. 24, in optical recording and reproduction at high line density, high frequency characteristics of the OTF degrade. Thus, according to the 9 bit/4 cell code for which k=4 and ML=5 selected in accordance with the first and the second conditions, a high frequency component of the PSD is suppressed, and a signal to noise ratio (S/N) necessary for reproduction is improved compared to the random block code, which is advantageous for reproduction. As a result, it is possible to easily implement recording and reproduction at high line density.

Note that the 9 bit/4 cell code for which k=4 and ML=5 selected in accordance with the first and the second conditions is not a sliding block code, and thus, an error does not propagate upon decoding.

Figure 25:
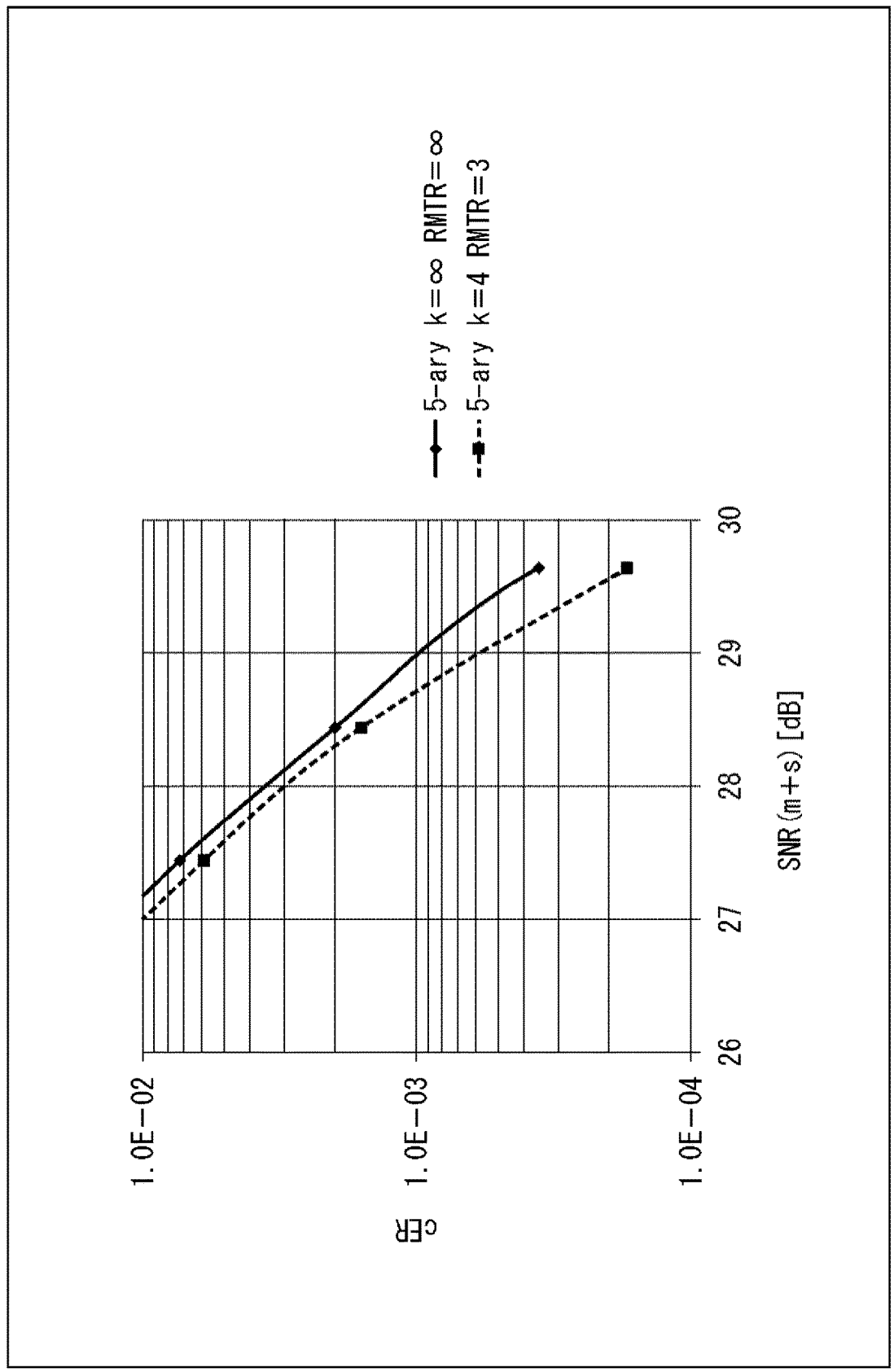
FIG. 25 is a diagram illustrating a result of simulation of an error rate in a case where the 9 bit/4 cell codes for which k=4 and ML=5 selected in accordance with the first and the second conditions are recorded and reproduced at line density of 115% of AD2.

FIG. 25 is a diagram illustrating a result of simulation of an error rate in a case where the 9 bit/4 cell codes for which k=4 and ML=5 selected in accordance with the first and the second conditions are recorded and reproduced at line density of 115% of AD2.

FIG. 25 indicates an S/N on a horizontal axis and indicates an error rate on a vertical axis.

Note that FIG. 25 illustrates an error rate of the random block code generated from the code generation model for which k=4 and ML=5 along with an error rate of the 9 bit/4 cell code for which k=4 and ML=5 selected in accordance with the first and the second conditions (portion indicated with a dotted line in FIG. 25).

It can be confirmed from FIG. 25 that an error rate of the 9 bit/4 cell code for which k=4 and ML=5 selected in accordance with the first and the second conditions becomes approximately ½ of an error rate of the random block code at an S/N of approximately 29.6 dB.

According to the block codes constituted with the multilevel edge codes expressing the multilevel codes of the ML value which is equal to or greater than 3, which are generated through state transition of the code generation model and selected in accordance with the first and the second conditions as described above, it is possible to perform encoding while limiting the maximum number of consecutive times k and the RMTR and setting the code rate at equal to or higher than 1.0. Further, it is possible to perform reproduction while effectively utilizing a passband of the OTF by limiting the RMTR, so that it is possible to improve an S/N necessary for reproducing data recorded at high line density.

Still further, it is possible to easily perform digital sum value (DSV) control by inserting a DCC code for the block codes constituted with the multilevel edge codes expressing the multilevel codes of the ML value which is equal to or greater than 3, which are generated through state transition of the code generation model and selected in accordance with the first and the second conditions.

Subsequently, generation of (the multilevel codes expressed with) the multilevel edge codes using the code generation model will be described using an example of the multilevel edge codes for which the number of values ML which the multilevel code can assume is 4.

<Multilevel Edge Codes for which ML=4>

Figure 26:
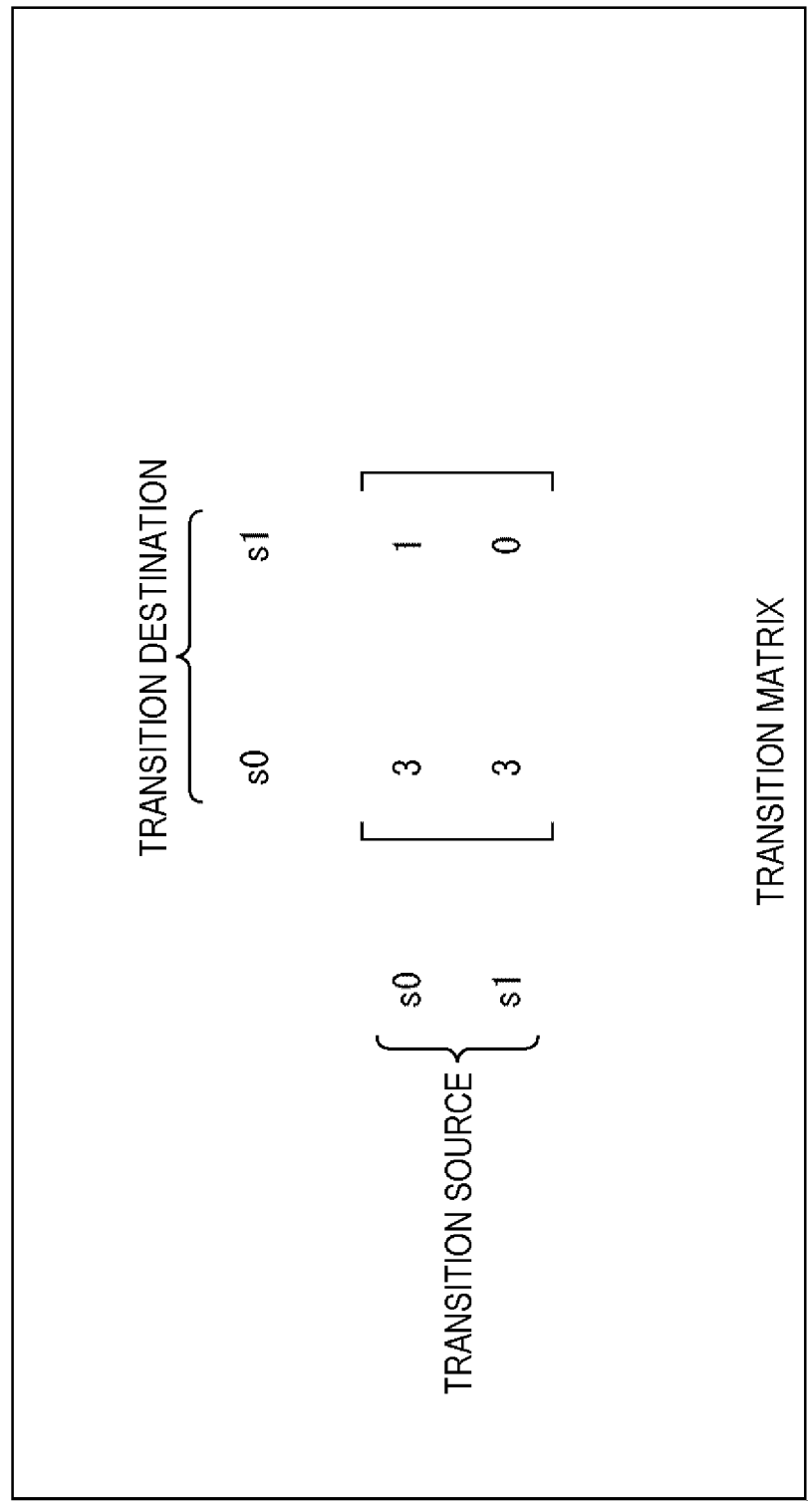
FIG. 26 is a diagram illustrating a transition matrix representing state transition of a code generation model for generating multilevel edge codes for which ML=4 and the maximum number of consecutive times k=1.

FIG. 26 is a diagram illustrating a transition matrix representing state transition of the code generation model for generating multilevel edge codes for which ML=4 and the maximum number of consecutive times k=1.

In the transition matrix in FIG. 26, in a similar manner to FIG. 9, each row represents a state of a transition source of the state transition, and each column represents a state of a transition destination of the state transition. An element in row i and column j represents the number of ways of state transition from a state s #i to a state s #j existing in the code generation model.

A code generation model for which k=1 and ML=4 (a code generation model which generates the multilevel edge code for which the maximum number of consecutive times k=1 and ML=4), three ways of state transition which output the multilevel edge codes 1, 2, and 3 exist as state transition from the state s0 to the state s0. One way of state transition which outputs the multilevel edge code 0 exists as state transition from the state s0 to the state s1, and three ways of state transition which output the multilevel edge codes 1 to 3 exist as state transition from the state s1 to the state s0. There is no state transition from the state s1 to the state s1.

Two eigenvalues EV[0] and EV[1] of the transition matrix in FIG. 26 are respectively EV[0]≈3.791288+j0 and EV[1]≈0.79129+j0. Thus, Shannon capacity of (the multilevel codes expressed with) the multilevel edge codes generated with the code generation model for which k=1 and ML=4 becomes (approximately) 3.791288 which is a maximum value among values which assume positive real number among the two eigenvalues EV[0] and EV[1], so that it is possible to express 3.791288 values per one cell.

Further, the theoretical limitation code rate of the multilevel codes expressed with the multilevel edge codes generated with the code generation model for which k=1 and ML=4, that is, the maximum bit length of binary data which can be theoretically allocated to one cell of the multilevel code can be obtained as (approximately) $1.922688=\log_2 3.791288$ bits by calculating $\log_2$ of the Shannon capacity of 3.791288.

Figure 27:
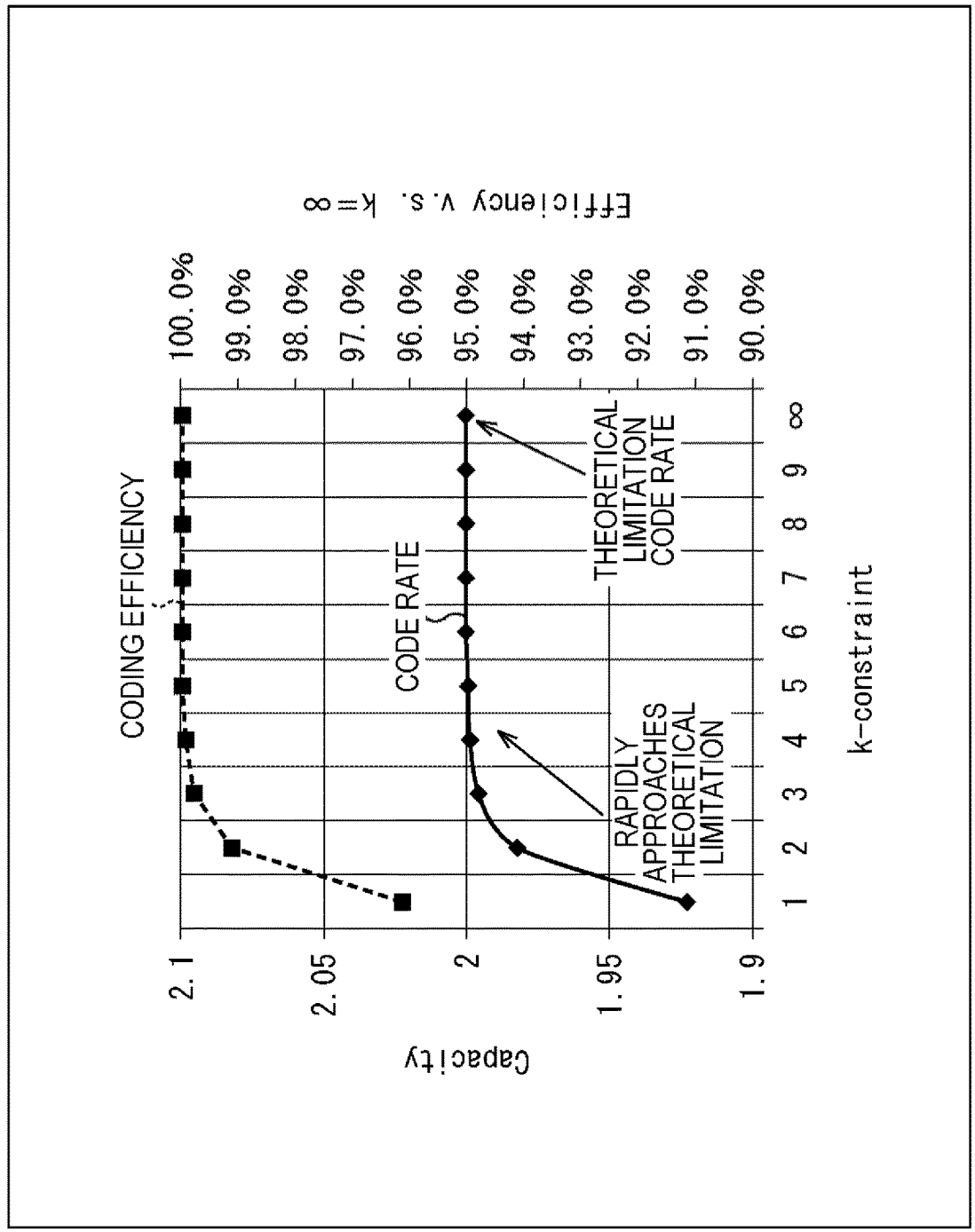
FIG. 27 is a diagram illustrating relationship among the maximum number of consecutive times k for multilevel codes for which ML=4, a code rate, and coding efficiency.

FIG. 27 is a diagram illustrating relationship among the maximum number of consecutive times k for multilevel codes for which ML=4, a code rate, and coding efficiency.

Here, while the theoretical limitation code rate of the multilevel codes for which ML=4 in a case where the maximum number of consecutive times k=∞ is $2=\log_2 4$, the code rate in FIG. 27 represents a ratio of the code rate with respect to this theoretical limitation code rate 2 in a case where the maximum number of consecutive times k=∞.

According to FIG. 27, in a case where the maximum number of consecutive times k of the multilevel codes for which ML=4 becomes equal to or greater than 2, similarly to the case of the multilevel codes for which ML=5 (FIG. 10), it can be confirmed that the code rate rapidly approaches the theoretical limitation code rate, and the coding efficiency becomes equal to or higher than 99%.

A block code constituted with the multilevel codes (expressed with the multilevel edge codes) for which ML=4 among block codes which are constituted with a sequence of multilevel codes of n cells and which have a fixed length will be described below.

<Block Code>

FIG. 28 is a diagram illustrating specifications of a block code constituted with multilevel codes for which ML=4 in a case where the maximum number of consecutive times k=5.

In FIG. 28, the code length n, the number of symbols Ns, the bit length B of binary data, the code rate R, and the coding efficiency Ef are as described with FIG. 11.

Generation of a block code which has high coding efficiency of 90%, which has the code length n of five cells, and which is constituted with (the multilevel edge codes expressing) the multilevel codes for which k=5 and ML=4 among the block codes in FIG. 28, for example, will be described below.

Note that the block code which has the code length n of five cells and which is constituted with the multilevel codes for which k=5 and ML=4 is a 9 bit/5 cell code for which k=5 and ML=4, and which can encode binary data having bit length B=9 bits.

Figure 29:
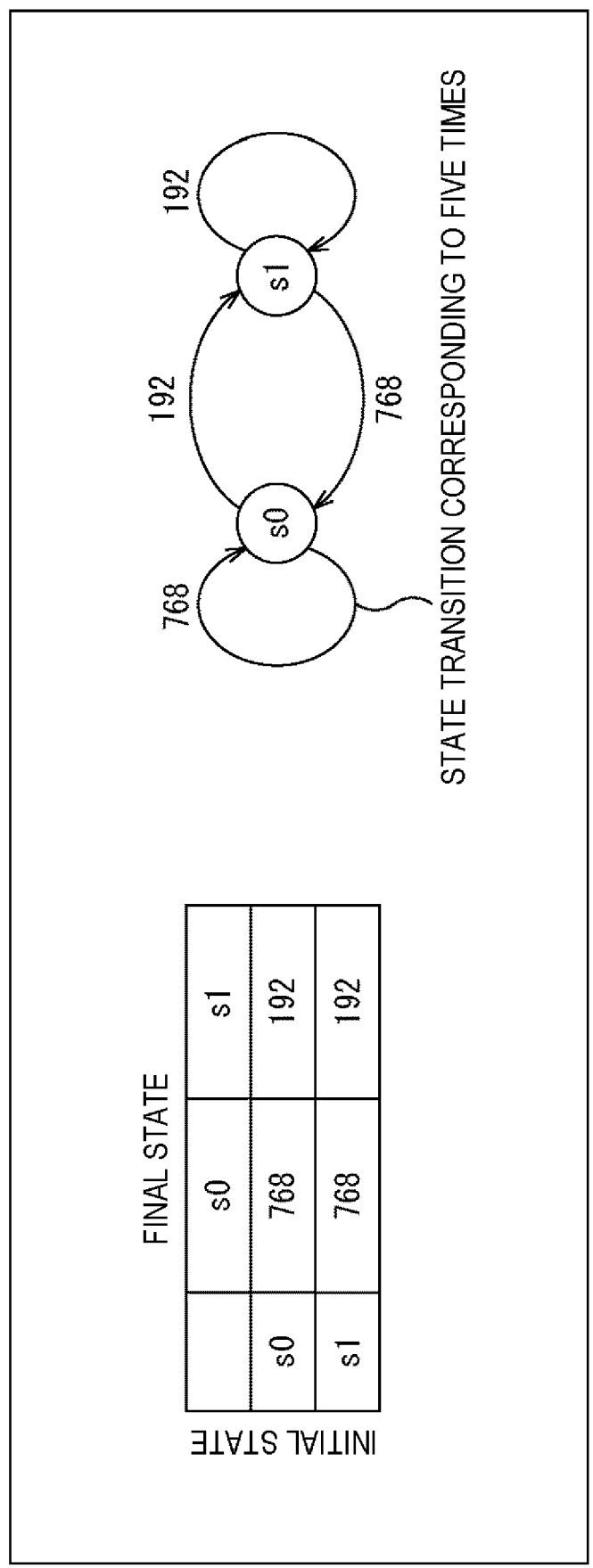
FIG. 29 is a diagram for explaining 9 bit/5 cell codes for which ML=4.

FIG. 29 is a diagram for explaining 9 bit/5 cell codes for which ML=4.

((A sequence of) the multilevel edge codes expressing) the 9 bit/5 cell code for which k=5 and ML=4 can be generated through five times of state transition from a certain state as an initial state in the code generation model for which k=5 and ML=4.

FIG. 29 illustrates the number of block codes s0→s0 codes constituted with a sequence of the multilevel edge codes generated through five times of state transition from the state s0 as the initial state to the state s0 as the final state, block codes s0→s1 codes constituted with a sequence of the multilevel edge codes generated through five times of state transition from the state s0 as the initial state to the state s1 as the final state, block codes s1→s0 codes constituted with a sequence of the multilevel edge codes generated through five times of state transition from the state s1 as the initial state to the state s0 as the final state, and block codes s1→s1 codes constituted with a sequence of the multilevel edge codes generated through five times of state transition from the state s1 as the initial state to the state s1 as the final state.

There exist 768 s0→s0 codes, and 192 s0→s1 codes. There exist 768 s1→s0 codes, and 192 s1→s1 codes.

FIG. 30 is a diagram illustrating 768 s0→s0 codes and 768 s1→s0 codes and part of state transition in a case where the s0→s0 codes and the s1→s0 codes are generated.

A of FIG. 30 illustrates 768 s0→s0 codes and part of state transition in a case where the 768 s0→s0 codes are generated. B of FIG. 30 illustrates 768 s1→s0 codes and part of state transition in a case where the 768 s1→s0 codes are generated.

The present inventor has confirmed that regarding 9 bit/5 cell codes for which k=5 and ML=4, similarly to 9 bit/4 cell codes for which k=4 and ML=5, the same code can be obtained for the 768 s0→s0 codes and the 768 s1→s0 codes while ways of the state transition are not the same.

In other words, the 768 s0→s0 codes as a first set of block codes constituted with a sequence of the multilevel edge codes generated through state transition from the state s0 (first state) as the initial state to the state s0 (second state) as the final state match the 768 s1→s0 codes as a second set of block codes constituted with a sequence of the multilevel edge codes generated through state transition from the state s1 (third state) as the initial state to the state s0 (fourth state) as the final state.

FIG. 31 is a diagram illustrating 192 s0→s1 codes and 192 s1→s1 codes and part of state transition in a case where the s0→s1 codes and the s1→s1 codes are generated.

A of FIG. 31 illustrates 192 s0→s1 codes and part of state transition in a case where the 192 s0→s1 codes are generated. B of FIG. 31 illustrates 192 s1→s1 codes and part of state transition in a case where the 192 s1→s1 codes are generated.

The present inventor has confirmed that regarding 9 bit/5 cell codes for which k=5 and ML=4, similarly to 9 bit/4 cell codes for which k=4 and ML=5, the same code can be obtained for the 192 s0→s1 codes and the 192 s1→s1 codes while ways of the state transition are not the same.

In other words, the 192 s0→s1 codes as a first set of block codes constituted with a sequence of the multilevel edge codes generated through state transition from the state s0 (first state) as the initial state to the state s1 (second state) as the final state match the 192 s1→s1 codes as a second set of block codes constituted with a sequence of the multilevel edge codes generated through state transition from the state s1 (third state) as the initial state to the state s1 (fourth state) as the final state.

A total of 960 block codes including 768 s0→s0 codes and 192 s0→s1 codes generated through five times of state transition from the state s0 as the initial state matches a total of 960 block codes including 768 s1→s0 codes and 192 s1→s1 codes generated through five times of state transition from the state s1 as the initial state.

Thus, in channel encoding, in a case where the 960 block codes generated through five times of state transition from the state s0 or the state s1 as the initial state, it is not necessary to monitor a final state in a case where binary data of immediately preceding nine bits is encoded or an initial state in a case where binary data immediately following nine bits is encoded in encoding of new binary data of 9 bits. In other words, binary data can be encoded while the final state in a case where the immediately preceding binary data is encoded and the initial state in a case where the immediately following binary data is encoded are regarded as the state s0 or s1.

Concerning a 9 bit/5 cell code for which k=5 and ML=4, 960 block codes generated through five times of state transition from the state s0 as the initial state (or 960 block codes generated through five times of state transition from the state s1 as the initial state) are set as candidate codes which become candidates for codes to be employed in encoding.

Then, $512=2^9$ codes which are to be employed to encode binary data of nine bits (which are to be allocated to binary data of nine bits) are selected from the 960 candidate codes.

<RMTR>

Figure 32:
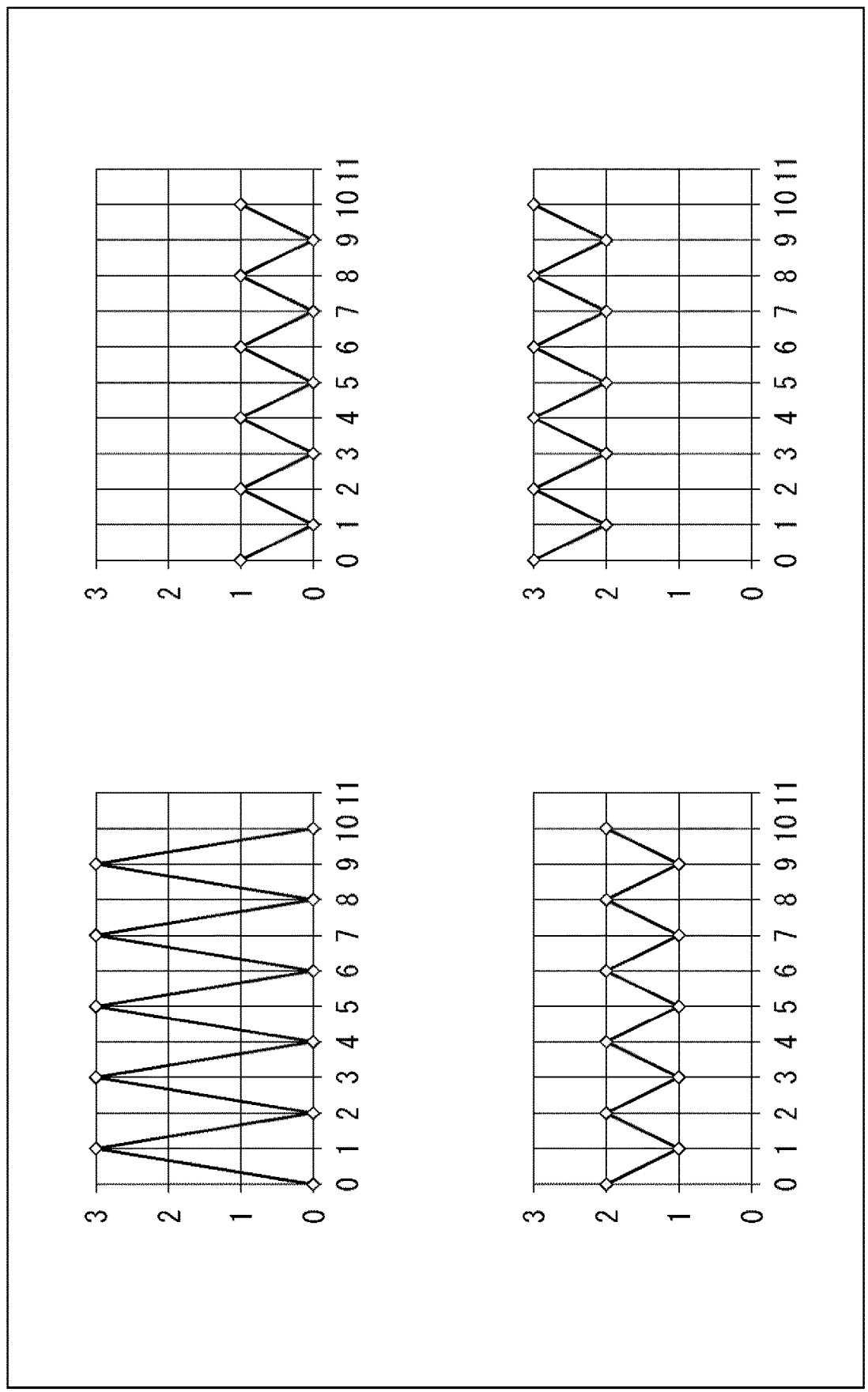
FIG. 32 is a diagram illustrating a minimum transition pattern occurring in a sequence of multilevel codes for which ML=4.
Figure 33:
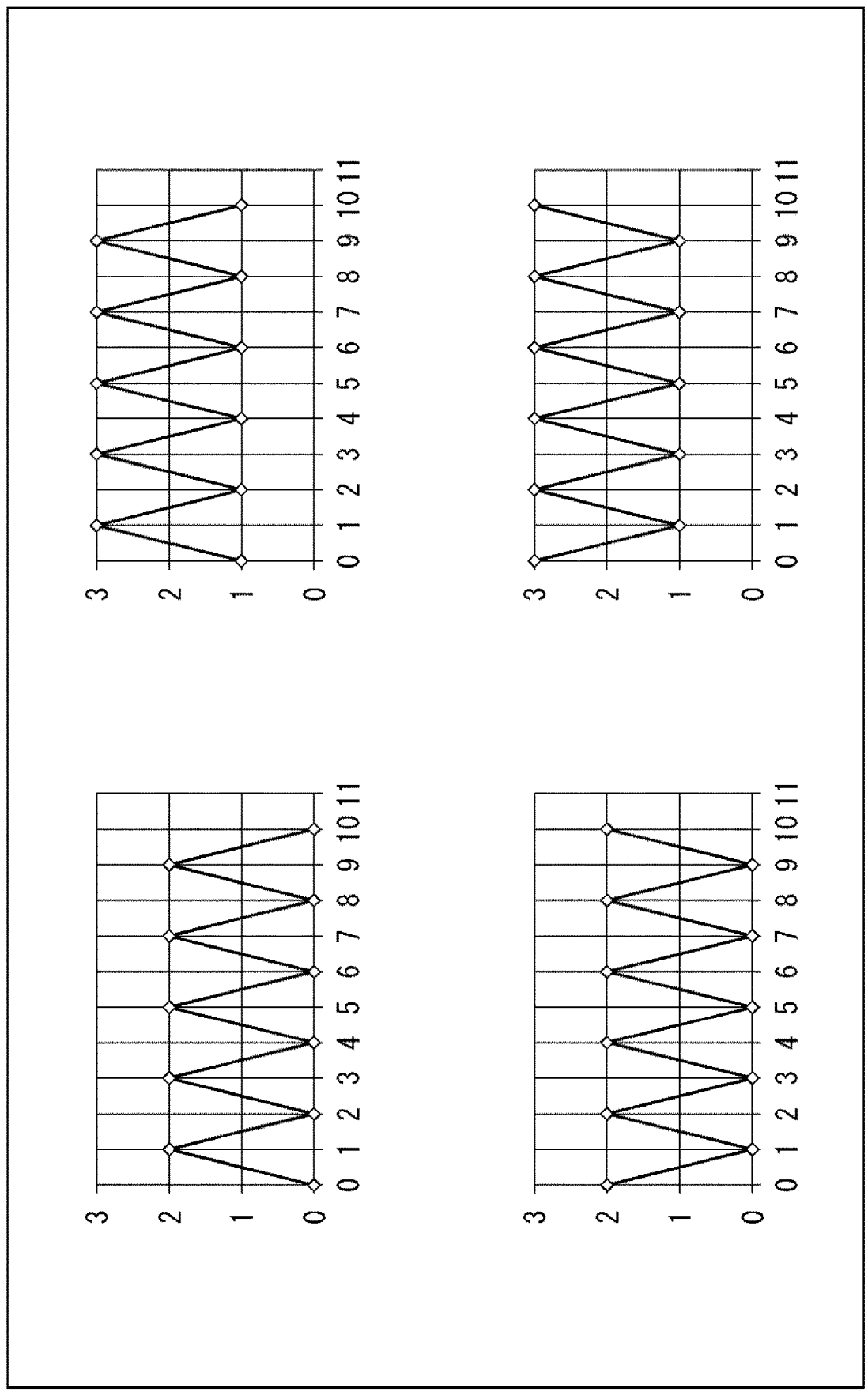
FIG. 33 is a diagram illustrating a minimum transition pattern occurring in a sequence of multilevel codes for which ML=4.

FIGS. 32 and 33 are diagrams illustrating a minimum transition pattern occurring in a sequence of multilevel codes for which ML=4.

FIG. 32 illustrates a minimum transition pattern occurring in the multilevel codes in a case where 31 is repeated in (the block code constituted with) the multilevel edge codes for which ML=4, and FIG. 33 illustrates a minimum transition pattern occurring in the multilevel codes in a case where 22 is repeated in the multilevel edge codes for which ML=4.

(A sequence of) the multilevel edge codes 31 for which ML=4 satisfy the modulo edge condition and appear in the minimum transition pattern.

In other words, for example, in a case where the (immediately preceding) multilevel code l(t−1) is 0, in a case where 31 which satisfies the modulo edge condition continues as the multilevel edge codes, the multilevel code l(t) at time t becomes (l(t−1)+c(t)) % ML=(0+3)% 4=3. Further, the multilevel code l(t+1) at time t+1 becomes (l(t)+c(t+1))% ML=(3+1)% 4=0. Still further, the multilevel code l(t+2) at time t+2 becomes (l(t+1)+c(t+2))% ML=(0+3)% 4=3. In a similar manner, the subsequent multilevel codes appear in a minimum transition pattern in which 0 and 3 are repeated.

As described above, in a case where 31 which satisfies the modulo edge condition continues as the multilevel edge codes, in a case where the immediately preceding multilevel code is 0, the multilevel codes appear in a minimum transition pattern in which 0 and 3 are repeated as illustrated in FIG. 32.

In a case where the immediately preceding multilevel code is 1, the multilevel codes appear in a minimum transition pattern in which 1 and 0 are repeated as illustrated in FIG. 32, and in a case where the immediately preceding multilevel code is 2, the multilevel codes appear in a minimum transition pattern in which 2 and 1 are repeated as illustrated in FIG. 32. In a case where the immediately preceding multilevel code is 3, the multilevel codes appear in a minimum transition pattern in which 3 and 2 are repeated as illustrated in FIG. 32.

In addition, the multilevel edge codes 22 for which ML=4 satisfy the modulo edge condition and appear in the minimum transition pattern.

That is, in a case where the immediately preceding multilevel code is 0, the multilevel codes appear in a minimum transition pattern in which 0 and 2 are repeated as illustrated in FIG. 33, and in a case where the immediately preceding multilevel code is 1, the multilevel codes appear in a minimum transition pattern in which 1 and 3 are repeated as illustrated in FIG. 33. In a case where the immediately preceding multilevel code is 2, the multilevel codes appear in a minimum transition pattern in which 2 and 0 are repeated as illustrated in FIG. 33, and in a case where the immediately preceding multilevel code is 3, the multilevel codes appear in a minimum transition pattern in which 3 and 1 are repeated as illustrated in FIG. 33.

Also in a case where 13 which satisfies the modulo edge condition continues as the multilevel edge codes, the multilevel codes appear in a minimum transition pattern in a similar manner.

FIG. 34 is a diagram illustrating a start continuous length and a termination continuous length of 768 s0→s0 codes (or s1→s0 codes) and 192 s0→s1 codes (or 192 s1→s1 codes) which are 960 candidate codes for the 9 bit/5 cell code for which k=5 and ML=4.

In FIG. 34, in a similar manner to FIG. 17, each row represents the start continuous length, and each column represents the termination continuous length. A value in a field of the start continuous length of i and the termination continuous length of j indicates the number of candidate codes whose start continuous length is i and termination continuous length is j.

A of FIG. 34 illustrates a start continuous length and a termination continuous length for 768 s0→s0 codes among 960 candidate codes for the 9 bit/5 cell code for which k=5 and ML=4. B of FIG. 34 illustrates a start continuous length and a termination continuous length for 192 s0→s1 codes among 960 candidate codes for the 9 bit/5 cell code for which k=5 and ML=4.

According to FIG. 34, 768 s0→s0 codes include 468 (0, 0) codes which are block codes for which the start continuous length i is 0 and the termination continuous length j is limited to 0, 117 (0, 1) codes which are block codes for which the start continuous length i is 0 and the termination continuous length j is limited to 1, 30 (0, 2) codes which are block codes for which the start continuous length i is 0 and the termination continuous length j is limited to 2, 9 (0, 3) codes which are block codes for which the start continuous length i is 0 and the termination continuous length j is limited to 3, 3 (0, 4) codes which are block codes for which the start continuous length i is 0 and the termination continuous length j is limited to 4, 81 (1, 0) codes which are block codes for which the start continuous length i is 1 and the termination continuous length j is limited to 0, 21 (1, 1) codes which are block codes for which the start continuous length i is 1 and the termination continuous length j is limited to 1, 6 (1, 2) codes which are block codes for which the start continuous length i is 1 and the termination continuous length j is limited to 2, 21 (2, 0) codes which are block codes for which the start continuous length i is 2 and the termination continuous length j is limited to 0, 6 (2, 1) codes which are block codes for which the start continuous length i is 2 and the termination continuous length j is limited to 1, and 3 (3, 0) codes which are block codes for which the start continuous length i is 3 and the termination continuous length j is limited to 0.

Further, 192 s0→s1 codes include 156 (0, 0) codes, 27 (1, 0) codes, 6 (2, 0) codes, and 3 (3, 0) codes.

As described above, in 960 candidate codes for the 9 bit/5 cell code for which k=5 and ML=4, 768 s0→s0 codes include 468 (0, 0) codes (A of FIG. 34), and 192 s0→s1 codes include 156 (0, 0) codes (B of FIG. 34), which results in 624 (0, 0) codes in total.

624 (0, 0) codes are block codes for which the start continuous length and the termination continuous length are 0 which is a minimum, and thus, by employing 624 (0, 0) codes which are equal to or more than 512 which is the necessary number of codes, as candidate codes, the first condition that a candidate code having a smaller start continuous length and a smaller termination continuous length is selected as a code to be employed is satisfied.

Further, a minimum length of the modulo edge of the (0, 0) code is 1=0+0+1. It is therefore possible to constitute (a set of) 9 bit/5 cell codes for which k=5 and ML=4 and for which the RMTR is limited to 1-0+0+1 which is the minimum length of the modulo edge by selecting arbitrary 512 block codes from 624 (0, 0) codes which are set as candidate codes if 624 (0, 0) codes do not include two or more block codes for which the middle continuous length is greater than the minimum length of the modulo edge of the (0, 0) code.

However, the present inventor has confirmed that 468 (0, 0) codes in s0→s0 codes and 156 (0, 0) codes in s0→s1 codes include (0, 0) codes whose middle continuous length is 2.

Specifically, concerning the s0→s0 codes, 468 (0, 0) codes include 6 *131*, 6 *313*, and 6 *222* as (0, 0) codes for which the middle continuous length is 2 or greater. Concerning s0→s1 codes, 156 (0, 0) codes include 3 *131*, 3 *313*, and 3 *222* as (0, 0) codes for which the middle continuous length is 2 or greater. Here, * is a value of one of 0 to 3 (=ML−1) which does not satisfy the modulo edge condition between adjacent (cells of) the multilevel edge codes.

In a case where codes to be employed are selected from 624 (0, 0) codes as candidate codes for the 9 bit/5 cell code for which k=5 and ML=4, (0, 0) codes for which the middle continuous length is greater than the minimum length of the modulo edge are excluded from codes to be employed, eventually, from the candidate codes in accordance with the second condition.

In other words, concerning s0→s0 codes, 6 *131*, 6 *313*, and 6 *222* which are (0, 0) codes for which the middle continuous length is 2 are excluded from 468 (0, 0) codes, and the remaining 450 (0, 0) codes are set as the candidate codes.

In other words, concerning s0→s1 codes, 3 *131*, 3 *313*, and 3 *222* which are (0, 0) codes for which the middle continuous length is 2 are excluded from 156 (0, 0) codes, and the remaining 147 (0, 0) codes are set as the candidate codes.

450 (0, 0) codes in s0→s0 codes and 147 (0, 0) codes in s0→s1 codes which are left as the candidate codes as described above are 597 in total which is equal to or more than 512 which is the necessary number of codes, and the 9 bit/5 cell code for which k=5 and ML=4 and for which the RMTR is limited to 1 which is the minimum length of the modulo edge can be constituted by 512 candidate codes being selected as codes to be employed from the 597 candidate codes.

For example, the 9 bit/5 cell code for which k=5 and ML=4 and for which the RMTR is limited to 1 which is the minimum length of the modulo edge can be constituted by all of 147 (0, 0) codes of s0→s1 codes being selected as codes to be employed and 365=512−147 which is the rest of the necessary number of codes of 512 being selected as codes to be employed from 450 (0, 0) codes of s0→s0 codes.

The block codes selected as 512 codes employed as the 9 bit/5 cell code for which k=5 and ML=4 can be registered in the code LUT of the LUT storage unit 51 in FIG. 4 as described above. In this case, the RMTR of the block codes registered in the code LUT becomes 1 which is the minimum length of the modulo edge. It can be said that the 9 bit/5 cell for which k=5 and ML=4, which is selected from candidate codes from which block codes whose middle continuous length exceeds the minimum length of the modulo edge are excluded as described above are block codes for which the middle continuous length is limited to equal to or smaller than the minimum length of the modulo edge.

FIGS. 35, 36, 37, 38, 39, and 40 are diagrams illustrating an example of a code LUT in which 512 block codes are registered as 9 bit/5 cell codes for which k=5 and ML=4.

In the code LUT, (multilevel edge codes constituting) the block code selected as the code to be employed as described in FIG. 34 and binary data are registered in association with each other. According to the code LUT in FIG. 35 to FIG. 40, for example, binary data 0 (here, zero expressed with nine bits) is encoded into (multilevel edge codes of five cells constituting) a block code 11111.

Figure 41:
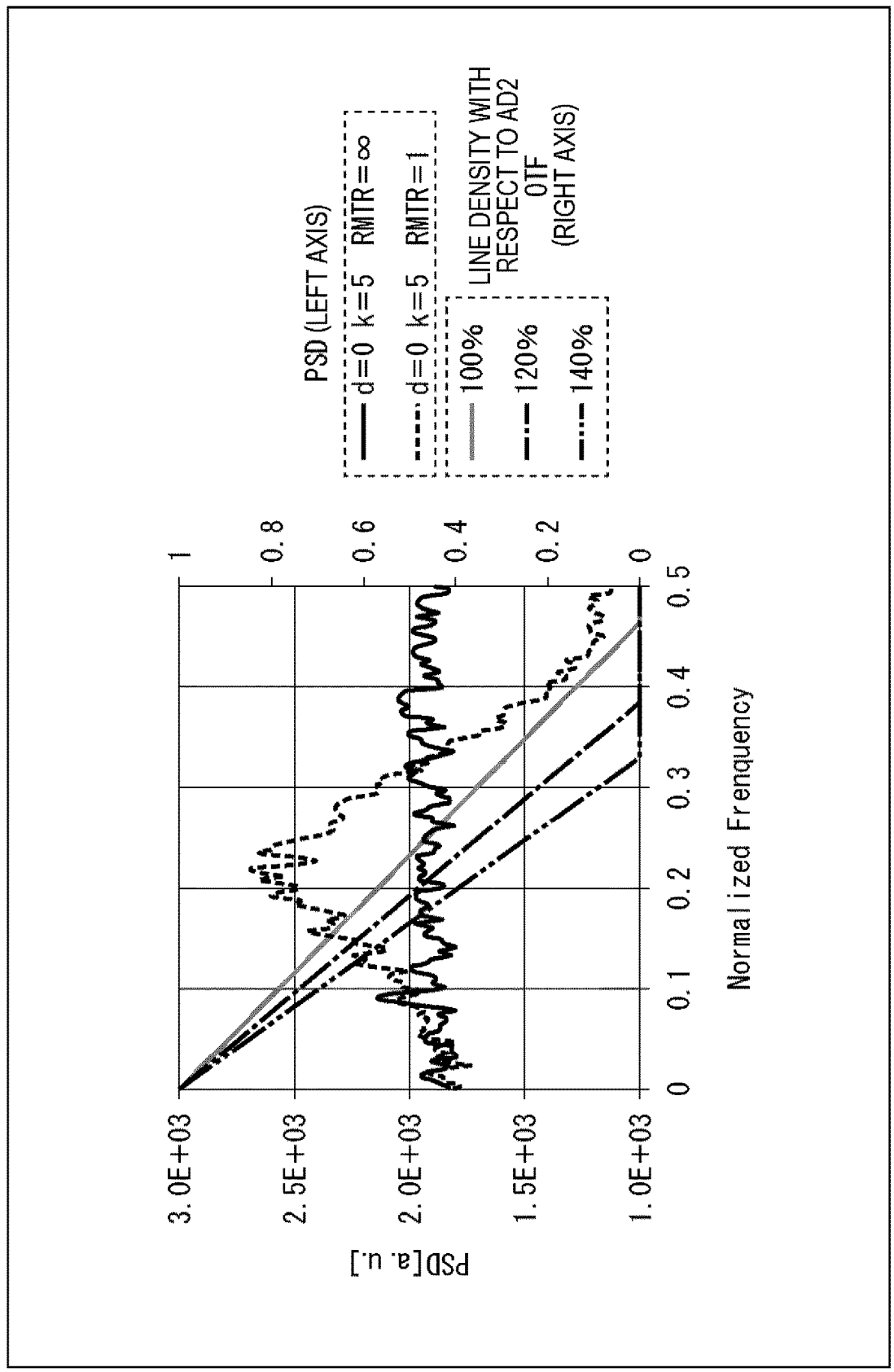
FIG. 41 is a diagram illustrating PSD of the 9 bit/5 cell codes for which k=5 and ML=4 selected in accordance with the first and the second conditions.

FIG. 41 is a diagram illustrating PSD of the 9 bit/5 cell codes for which k=5 and ML=4 selected in accordance with the first and the second conditions.

FIG. 41 indicates, in a similar manner to FIG. 24, a normalized frequency normalized with a frequency of a channel clock on a horizontal axis and indicates PSD on a vertical axis.

Further, FIG. 41 illustrates the PSD of the random block code randomly generated from the code generation model for which k=5 and ML=4 and the OTF as characteristics of optical recording and reproduction in which line density with respect to the AD2 format is 100%, 120%, and 140% along with the PSD (portion indicated with a dotted line in FIG. 41) of the 9 bit/5 cell code for which k=5 and ML=4, which is selected in accordance with the first and the second conditions in a similar manner to FIG. 24.

The RMTR of the random block code is not limited (RMTR=∞). Further, a minimum value d of the number of times that zero is consecutive of both the 9 bit/5 cell code for which k=5 and ML=4 selected in accordance with the first and the second conditions, and the random block code, is 0.

It can be confirmed that according to the 9 bit/5 cell code for which k=5 and ML=4, and which is selected in accordance with the first and the second conditions, a high frequency component of the PSD near and after a frequency of ½ of the channel clock is suppressed in a similar manner to the PSD (FIG. 24) of the 9 bit/4 cell code for which k=4 and ML=5, and which is selected in accordance with the first and the second conditions by limitation of the RMTR=1.

Thus, according to the 9 bit/5 cell code for which k=5 and ML=4, and which is selected in accordance with the first and the second conditions, the high frequency component of the PSD is suppressed, and an S/N which is necessary for reproduction is improved compared to that in the random block code, which is advantageous for reproduction. As a result, it is possible to easily implement recording and reproduction at high line density.

Figure 42:
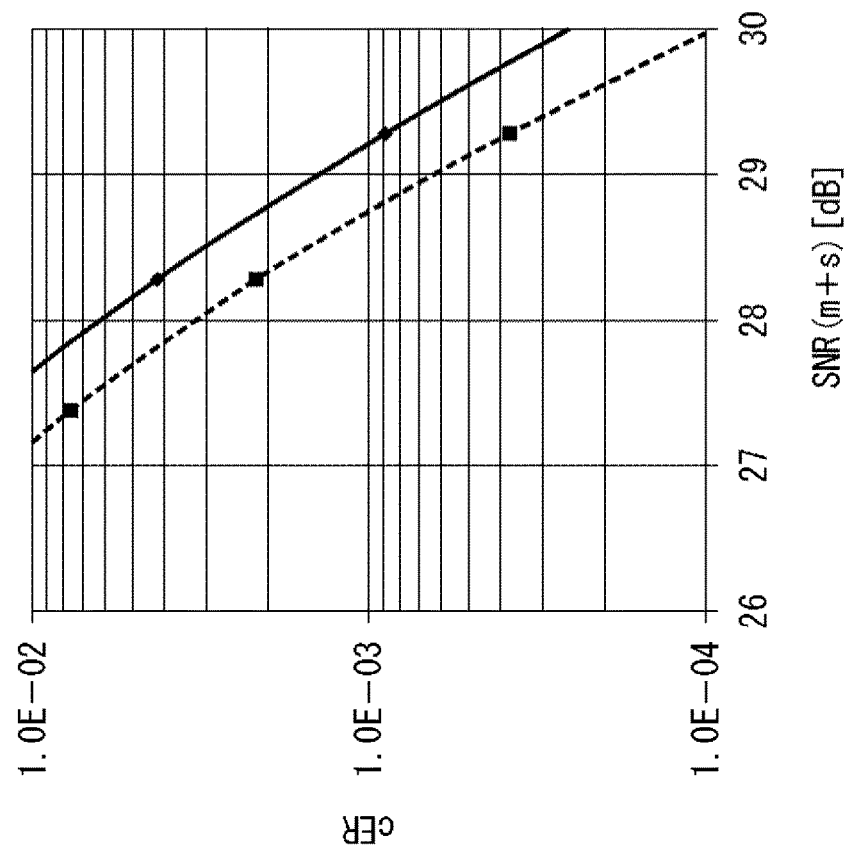
FIG. 42 is a diagram illustrating a result of simulation of an error rate in a case where the 9 bit/5 cell codes for which k=5 and ML=4 selected in accordance with the first and the second conditions are recorded and reproduced at line density of 120% of AD2.

FIG. 42 is a diagram illustrating a result of simulation of an error rate in a case where the 9 bit/5 cell codes for which k=5 and ML=4 selected in accordance with the first and the second conditions are recorded and reproduced at line density of 120% of AD2.

FIG. 42 indicates an S/N on a horizontal axis and indicates an error rate on a vertical axis.

Note that FIG. 42 illustrates an error rate of the random block code generated from the code generation model for which k=5 and ML=4 (portion indicated with a solid line in FIG. 42) along with an error rate of the 9 bit/5 cell code for which k=5 and ML=4 selected in accordance with the first and the second conditions (portion indicated with a dotted line in FIG. 42).

It can be confirmed from FIG. 42 that an error rate of the 9 bit/5 cell code for which k=5 and ML=4 selected in accordance with the first and the second conditions becomes approximately ½ of an error rate of the random block code at an S/N of approximately 29.3 dB.

The 9 bit/4 cell code for which k=4 and ML=5 and the 9 bit/5 cell code for which k=5 and ML=4 have been described above as the block code constituted with the multilevel codes of the ML value which is equal to or greater than 3. The block code to be used for channel encoding is not limited to the 9 bit/4 cell code for which k=4 and ML=5 and the 9 bit/5 cell code for which k=5 and ML=4.

In other words, it is possible to employ a block code constituted with a multilevel code of one cell or multilevel codes of two or more cells generated with the code generation model with arbitrary k and ML as the block code to be used for channel encoding.

<Description of Computer to which Present Technology is Applied>

Next, the series of processing described above can be performed by hardware or software. In the case where the series of processing is performed by software, a program that constitutes the software is installed in a general purpose computer, or the like.

Figure 43:
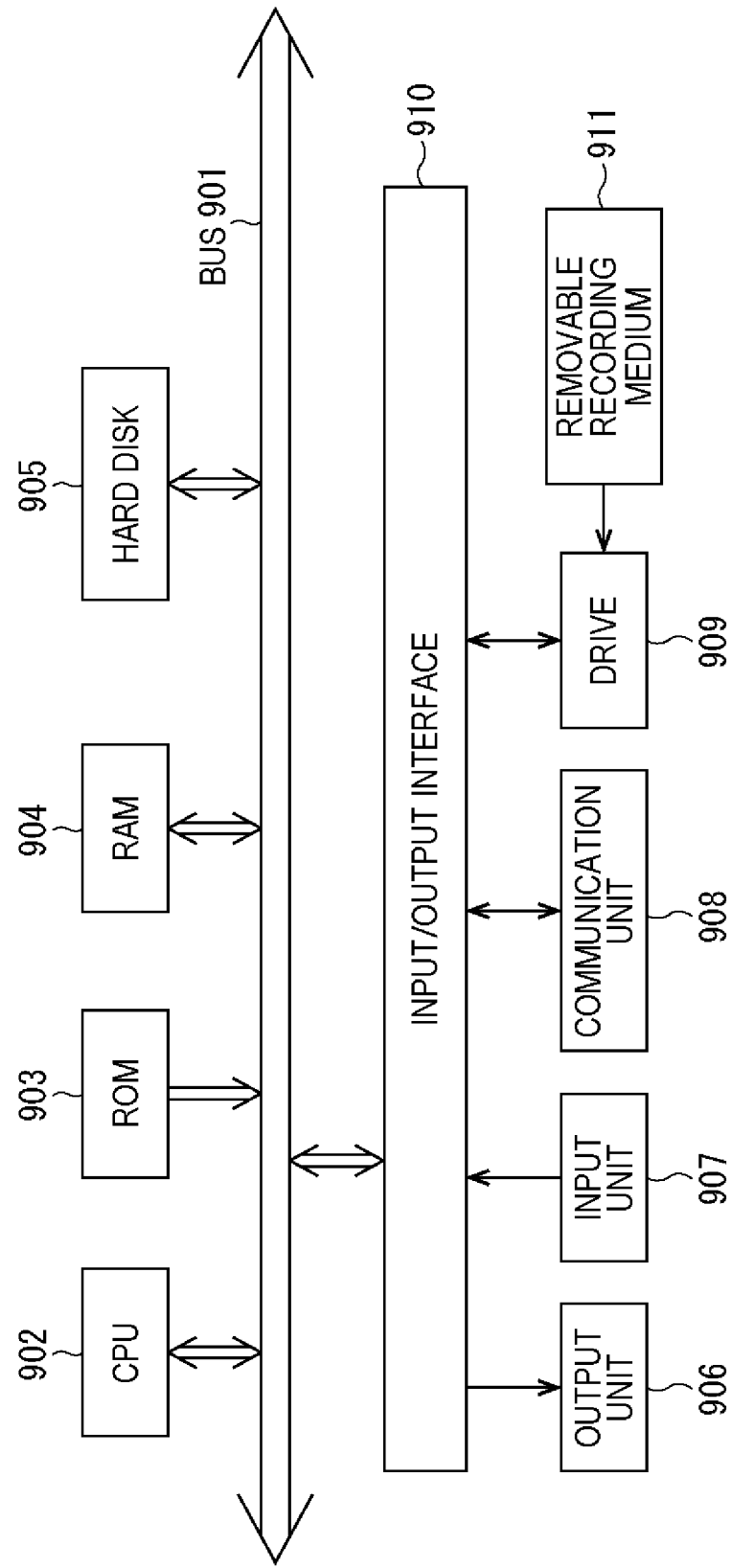
FIG. 43 is a block diagram illustrating a configuration example of an embodiment of a computer.

FIG. 43 is a block diagram illustrating a configuration example of an embodiment of a computer in which a program for executing the above-mentioned series of processing is installed.

It is possible to record the program in advance on a hard disk 905 or a ROM 903 serving as a recording medium incorporated in the computer.

Alternatively, the program can be stored (recorded) on a removable recording medium 911 driven by the drive 909. It is possible to provide such a removable recording medium 911 as so-called packaged software. In this regard, an example of the removable recording medium 911 includes, for example, a flexible disk, a compact disc read-only memory (CD-ROM), a magneto-optical (MO) disk, a digital versatile disc (DVD), a magnetic disk, and a semiconductor memory, and the like.

Moreover, it is possible to install the program in the computer from the removable recording medium 911 as described above or can be downloaded to the computer via a communication network or a broadcasting network to be installed in the hard disk 905 included therein. That is, in one example, it is possible to transfer the program to the computer from a download site via a satellite for digital satellite broadcasting in a wireless manner or to transfer it to the computer via a network such as a local area network (LAN) or the Internet in a wired manner.

The computer has a built-in central processing unit (CPU) 902, and an input/output interface 910 is connected to the CPU 902 via a bus 901.

If a user inputs a command to the CPU 902 via the input/output interface 910 by operating an input unit 907 or the like, the CPU 902 executes the program stored in the read-only memory (ROM) 903 in accordance with the command. Alternatively, the CPU 902 loads the program stored in the hard disk 905 into a random access memory (RAM) 904 and executes the program.

This allows the CPU 902 to execute the processing in accordance with the above-mentioned flowchart or the processing performed by using the configuration of the above-mentioned block diagram. Then, in one example, the CPU 902 outputs the result obtained by the processing through an output unit 906 or transmits the result through a communication unit 908 via the input/output interface 910 as necessary and records the result in the hard disk 905.

Moreover, the input unit 907 includes a keyboard, a mouse, a microphone, or the like. In addition, the output unit 906 includes a liquid crystal display (LCD), a speaker, or the like.

Here, in the present specification, processes executed by the computer in accordance with the program may not necessarily be executed chronologically in the order described as a flowchart. That is, the processes executed by the computer in accordance with the program also include processes executed in parallel or individually (for example, parallel processes or processes by objects).

Further, it is possible to process the program by a single computer (processor) or to dispersedly process it by a plurality of computers. Furthermore, it is possible to transfer the program to a remote computer for execution.

Note that the embodiments of the present technology are not limited to the above-described embodiments, and various changes can be made within a scope not deviating from the gist of the present technology.

Furthermore, the effects described in this specification are merely examples and are not limited, and other effects may be exerted.

Additionally, the present technology may also be configured as below.

<1>

A recording apparatus including:

an encoding unit configured to encode user data into a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of a multilevel code of an ML value which is equal to or greater than 3, and which generates the multilevel edge code expressing the multilevel code with the edge by state transition of transitioning to a state representing the number of times that zero is consecutive including 0 in a case where 0 is output and transitioning to a state representing that the number of times that zero is consecutive is 0 times in a case where one of 1 to ML−1 is output; and a recording unit configured to record the multilevel code whose value changes in accordance with the multilevel edge code in a recording medium.

<2>

The recording apparatus according to <1>, in which a maximum value of the number of times that zero is consecutive is limited to a predetermined maximum number of consecutive times k, and the code generation model includes states of the maximum number of consecutive times k+1.

<3>

The recording apparatus according to <1> or <2>, in which assuming that a t-th multilevel edge code is expressed as c(t), and a modulus operator is expressed as %, the recording unit records a t-th multilevel code l(t) obtained in accordance with an expression of l(t)=(l(t−1)+c(t)) % ML.

<4>

The recording apparatus according to any one of <1> to <3>, in which the encoding unit encodes the user data into the block code which is common between a first set of block codes constituted with a sequence of the multilevel edge codes generated through state transition from a first state as an initial state to a second state as a final state, and a second set of block codes constituted with a sequence of the multilevel edge codes generated through state transition from a third state as an initial state to a fourth state as a final state.

<5>

The recording apparatus according to any one of <1> to <4>, in which assuming that a t-th multilevel edge code is expressed as c(t), and a modulus operator is expressed as %, the encoding unit encodes the user data into a block code constituted with a sequence of the multilevel edge codes for which a continuous length of a modulo edge which is a number of times that an expression of (c(t)+c(t+1))% ML=0 is consecutively satisfied is limited.

<6>

The recording apparatus according to <5>, in which the encoding unit encodes the user data into the block code for which the continuous lengths of the modulo edges at a head portion, a tail portion and a middle portion of the block code are limited.

<7>

The recording apparatus according to <6>, in which the encoding unit encodes the user data
into the block code for which the continuous length of the modulo edge at the middle portion of the block code is limited to equal to or smaller than a minimum length of a modulo edge obtained by adding 1 to an addition value of the continuous length of the modulo edge at the head portion of the block code and the continuous length of the modulo edge at the tail portion of the block code.

<8>

A recording method including: encoding user data into a multilevel edge code generated through state transition of a code generation model
which includes a state representing a number of times that zero is consecutive corresponding to a number of ways of the number of times that zero is consecutive that an edge of zero is consecutive among edges representing a change amount from an immediately preceding value of a multilevel code of an ML value which is equal to or greater than 3, and
which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output; and
recording the multilevel code whose value changes in accordance with the multilevel edge code in a recording medium.

<9>

A reproduction apparatus including:
a reproducing unit configured to reproduce from a recording medium, a multilevel code whose value changes in accordance with a multilevel edge code generated through state transition of a code generation model
which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and
which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output; and
a decoding unit configured to decode the multilevel code.

<10>

The reproduction apparatus according to <9>, in which a maximum value of the number of times that zero is consecutive is limited to a predetermined number of consecutive times k, and the code generation model includes states of the maximum number of consecutive times k+1.

<11>

The reproduction apparatus according to <9> or <10>, in which assuming that a t-th multilevel edge code is expressed as c(t), and a modulus operator is expressed as %, a t-th multilevel code l(t) obtained in accordance with an expression l(t)=(l(t−1)+c(t)) % ML is recorded in the recording medium.

<12>

The reproduction apparatus according to any one of <9> to <11>, in which the block code is recorded in the recording medium, the block code being common between
a first set of block codes constituted with a sequence of the multilevel edge codes generated through state transition from a first state as an initial state to a second state as a final state, and
a second set of block codes constituted with a sequence of the multilevel edge codes generated through state transition from a third state as an initial state to a fourth state as a final state.

<13>

The reproduction apparatus according to any one of <9> to <12>, in which assuming that a t-th multilevel edge code is expressed as c(t), and a modulus operator is expressed as %, a block code constituted with a sequence of the multilevel edge codes for which a continuous length of a modulo edge which is a number of times that an expression of (c(t)+c(t+1))% ML=0 is consecutively satisfied is limited, is recorded in the recording medium.

<14>

The reproduction apparatus according to <13>, in which the block code for which the continuous lengths of the modulo edges at a head portion, a tail portion, and a middle portion of the block code are limited, is recorded in the recording medium.

<15>

The reproduction apparatus according to <14>, in which the block code for which the continuous length of the modulo edge at the middle portion of the block code is limited to equal to or smaller than a minimum length of a modulo edge obtained by adding 1 to an addition value of the continuous length of the modulo edge at the head portion of the block code and the continuous length of the module edge at the tail portion of the block code, is recorded in the recording medium.

<16>

A reproduction method including:
reproducing from a recording medium, a multilevel code whose value changes in accordance with a multilevel edge code generated through state transition of a code generation model
which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output; and decoding the multilevel code.

<17>

A recording medium in which a multilevel code is recorded, the multilevel code having a value which changes in accordance with a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output, and transitioning to a state representing that the number of times that zero is consecutive is 0 times in a case where one of 1 to ML−1 is output.

<18>

An encoding apparatus including:

an encoding unit configured to encode user data into a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

<19>

A decoding apparatus including:

a decoding unit configured to decode a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

REFERENCE SIGNS LIST

11 ECC processing unit
12 Frame constituting unit
13 Channel encoding unit
14 RUB constituting unit
15 Recording and reproduction system
16 Optical disk
17 Signal processing unit
18 DCC deleting unit
19 Channel decoding unit
20 Frame disassembling unit
21 ECC processing unit
22 Control unit
22A Registers
51 LUT storage unit
52 Code generating unit
31 ADC
32 PLL
33 Memory
34 Adaptive equalizer unit
35 Restoring unit
36 Convolution unit
37 Error computing unit
41 HPF
42 AGC
901 Bus
902 CPU
903 ROM
904 RAM
905 Hard disk
906 Output unit
907 Input unit
908 Communication unit
909 Drive
910 Input/output interface
911 Removable recording medium

The invention claimed is:

1. A recording apparatus comprising:

an encoding unit configured to encode user data into a multilevel edge code generated through state transition of a code generation model which includes a state representing a number of times that zero is consecutive corresponding to a number of ways of a number of times that zero is consecutive, which is a number of times that an edge of 0 is consecutive among edges representing a change amount from an immediately preceding value of a multilevel code of an ML value which is equal to or greater than 3, and which generates the multilevel edge code expressing the multilevel code with the edge by state transition of transitioning to a state representing the number of times that zero is consecutive including 0 in a case where 0 is output and transitioning to a state representing that the number of times that zero is consecutive is 0 times in a case where one of 1 to ML−1 is output; and a recording unit configured to record the multilevel code whose value changes in accordance with the multilevel edge code in a recording medium.

2. The recording apparatus according to claim 1,
wherein a maximum value of the number of times that zero is consecutive is limited to a predetermined maximum number of consecutive times k, and
the code generation model includes states of the maximum number of consecutive times k+1.

3. The recording apparatus according to claim 1,
wherein assuming that a t-th multilevel edge code is expressed as c(t), and a modulus operator is expressed as %,
the recording unit records a t-th multilevel code l(t) obtained in accordance with an expression of l(t)=(l(t−1)+c(t)) % ML.

4. The recording apparatus according to claim 1,
wherein the encoding unit encodes the user data into the block code which is common between
a first set of block codes constituted with a sequence of the multilevel edge codes generated through state transition from a first state as an initial state to a second state as a final state, and
a second set of block codes constituted with a sequence of the multilevel edge codes generated through state transition from a third state as an initial state to a fourth state as a final state.

5. The recording apparatus according to claim 1,
wherein assuming that a t-th multilevel edge code is expressed as c(t), and a modulus operator is expressed as %,
the encoding unit encodes the user data into a block code constituted with a sequence of the multilevel edge codes for which a continuous length of a modulo edge which is a number of times that an expression of (c(t)+c(t+1)) % ML=0 is consecutively satisfied is limited.

6. The recording apparatus according to claim 5,
wherein the encoding unit encodes the user data into the block code for which the continuous lengths of the modulo edges at a head portion, a tail portion, and a middle portion of the block code are limited.

7. The recording apparatus according to claim 6,
wherein the encoding unit encodes the user data
into the block code for which the continuous length of the modulo edge at the middle portion of the block code is limited to equal to or smaller than a minimum length of a modulo edge obtained by adding 1 to an addition value of the continuous length of the modulo edge at the head portion of the block code and the continuous length of the modulo edge at the tail portion of the block code.

8. A recording method comprising:
encoding user data into a multilevel edge code generated through state transition of a code generation model
which includes a state representing a number of times that zero is consecutive corresponding to a number of ways of the number of times that zero is consecutive that an edge of zero is consecutive among edges representing a change amount from an immediately preceding value of a multilevel code of an ML value which is equal to or greater than 3, and
which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output; and
recording the multilevel code whose value changes in accordance with the multilevel edge code in a recording medium.

9. A reproduction apparatus comprising:
a reproducing unit configured to reproduce from a recording medium, a multilevel code whose value changes in accordance with a multilevel edge code generated through state transition of a code generation model
which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and
which generates the multilevel edge code expressing the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output; and
a decoding unit configured to decode the multilevel code.

10. The reproduction apparatus according to claim 9,
wherein a maximum value of the number of times that zero is consecutive is limited to a predetermined number of consecutive times k, and
the code generation model includes states of the maximum number of consecutive times k+1.

11. The reproduction apparatus according to claim 9,
wherein assuming that a t-th multilevel edge code is expressed as c(t), and a modulus operator is expressed as %,
a t-th multilevel code l(t) obtained in accordance with an expression l(t)=(l(t−1)+c(t)) % ML is recorded in the recording medium.

12. The reproduction apparatus according to claim 9,
wherein the block code is recorded in the recording medium, the block code being common between
a first set of block codes constituted with a sequence of the multilevel edge codes generated through state transition from a first state as an initial state to a second state as a final state, and
a second set of block codes constituted with a sequence of the multilevel edge codes generated through state transition from a third state as an initial state to a fourth state as a final state.

13. The reproduction apparatus according to claim 9,
wherein assuming that a t-th multilevel edge code is expressed as c(t), and a modulus operator is expressed as %,
a block code constituted with a sequence of the multilevel edge codes for which a continuous length of a modulo edge which is a number of times that an expression of (c(t)+c(t+1)) % ML=0 is consecutively satisfied is limited, is recorded in the recording medium.

14. The reproduction apparatus according to claim 13,
wherein the block code for which the continuous lengths of the modulo edges at a head portion, a tail portion, and a middle portion of the block code are limited, is recorded in the recording medium.

15. The reproduction apparatus according to claim 14,
wherein the block code for which the continuous length of the modulo edge at the middle portion of the block code is limited to equal to or smaller than a minimum length of a modulo edge obtained by adding 1 to an addition value of the continuous length of the modulo edge at the head portion of the block code and the continuous length of the module edge at the tail portion of the block code, is recorded in the recording medium.

16. A reproduction method comprising:
reproducing from a recording medium, a multilevel code whose value changes in accordance with a multilevel edge code generated through state transition of a code generation model
which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and
which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output; and
decoding the multilevel code.

17. An encoding apparatus comprising:
an encoding unit configured to encode user data into a multilevel edge code generated through state transition of a code generation model
which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and
which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

18. A decoding apparatus comprising:
a decoding unit configured to decode a multilevel edge code generated through state transition of a code generation model
which includes a state representing a number of times that zero is consecutive corresponding to a number of ways of a number of times that zero is consecutive, which is a number of times that an edge of 0 is consecutive among edges representing a change amount from an immediately preceding value of the multilevel code of an ML value which is equal to or greater than 3, and
which generates the multilevel edge code which expresses the multilevel code with the edge through state transition of transitioning to a state representing the number of times that zero is consecutive including 0 in a case where 0 is output and transitioning to a state representing that the number of times that zero is consecutive is 0 times in a case where one of 1 to ML−1 is output.

* * * * *